United States Patent
Yoshida et al.

(10) Patent No.: US 8,163,573 B2
(45) Date of Patent: Apr. 24, 2012

(54) METHOD FOR MANUFACTURING NITRIDE SEMICONDUCTOR ELEMENT

(75) Inventors: Shunji Yoshida, Osaka (JP); Ryou Kato, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/294,537

(22) Filed: Nov. 11, 2011

(65) Prior Publication Data

US 2012/0058577 A1 Mar. 8, 2012

Related U.S. Application Data

(63) Continuation of application No. PCT/JP2010/006159, filed on Oct. 18, 2010.

(30) Foreign Application Priority Data

Nov. 12, 2009 (JP) ................................. 2009-258927

(51) Int. Cl.
*H01L 21/205* (2006.01)
*H01L 21/66* (2006.01)
*C30B 25/00* (2006.01)
*H01L 33/32* (2010.01)

(52) U.S. Cl. .............. 438/14; 438/478; 438/46; 117/85; 117/86; 117/952; 257/E21.108; 257/E21.521; 257/E21.525; 257/E21.529; 257/E33.028

(58) Field of Classification Search ................... 438/14, 438/478, 46; 117/85, 86, 952; 257/E21.108, 257/E21.521, E21.525, E21.529, E33.028
See application file for complete search history.

(56) References Cited

U.S. PATENT DOCUMENTS

| | | | | |
|---|---|---|---|---|
| 5,970,314 | A * | 10/1999 | Okahisa et al. ................. | 438/47 |
| 6,695,913 | B1 * | 2/2004 | Duggan .......................... | 117/94 |
| 6,764,888 | B2 * | 7/2004 | Khan et al. ..................... | 438/172 |
| 6,828,593 | B2 * | 12/2004 | Sugawara et al. .............. | 257/94 |
| 6,943,381 | B2 * | 9/2005 | Gardner et al. ............... | 257/103 |
| 6,998,281 | B2 * | 2/2006 | Taskar et al. ................... | 438/29 |

(Continued)

FOREIGN PATENT DOCUMENTS

JP 11-008407 A 1/1999

(Continued)

OTHER PUBLICATIONS

International Search Report for corresponding International Application No. PCT/JP2010/006159 mailed Jan. 11, 2011.

(Continued)

*Primary Examiner* — Mary Wilczewski
(74) *Attorney, Agent, or Firm* — Renner, Otto, Boisselle & Sklar, LLP

(57) ABSTRACT

$In_yGa_{1-y}N$ (0<y<1) layers whose principal surface is a non-polar plane or a semi-polar plane are formed by an MOCVD under different growth conditions. Then, the relationship between the growth temperature and the In supply mole fraction in a case where the pressure and the growth rate are constant is determined based on a growth condition employed for formation of $In_xGa_{1-x}N$ (0<x<1) layers whose emission wavelengths are equal among the $In_yGa_{1-y}N$ layers. Then, a saturation point is determined on a curve representing the relationship between the growth temperature and the In supply mole fraction, the saturation point being between a region where the growth temperature monotonically increases according to an increase of the In supply mole fraction and a region where the growth temperature saturates. Under a growth condition corresponding to this saturation point, an $In_xGa_{1-x}N$ layer is grown.

11 Claims, 12 Drawing Sheets

U.S. PATENT DOCUMENTS

| | | | |
|---|---|---|---|
| 7,115,167 B2 * | 10/2006 | Hooper et al. | 117/105 |
| 7,208,393 B2 | 4/2007 | Haskell et al. | |
| 7,348,606 B2 * | 3/2008 | Khan et al. | 257/103 |
| 7,751,455 B2 * | 7/2010 | Kneissl | 372/45.01 |
| 8,021,904 B2 * | 9/2011 | Chitnis | 438/46 |
| 2005/0167690 A1 * | 8/2005 | Gardner et al. | 257/103 |
| 2005/0245095 A1 | 11/2005 | Haskell et al. | |
| 2005/0263780 A1 * | 12/2005 | Bour et al. | 257/94 |
| 2007/0184637 A1 | 8/2007 | Haskell et al. | |
| 2009/0227093 A1 * | 9/2009 | Schaff et al. | 438/509 |
| 2010/0035410 A1 | 2/2010 | Sonobe et al. | |
| 2010/0187496 A1 * | 7/2010 | Yan | 257/13 |

FOREIGN PATENT DOCUMENTS

JP     2007-537600 T     12/2007

OTHER PUBLICATIONS

International Preliminary Report on Patentability for corresponding International Application No. PCT/JP2010/006159 mailed Jul. 5, 2011.

* cited by examiner

○ N
● Ga c-PLANE (0001)

METHOD FOR MANUFACTURING NITRIDE SEMICONDUCTOR ELEMENT

This is a continuation of International Application No. PCT/JP2010/006159, with an international filing date of Oct. 18, 2010, which claims priority of Japanese Patent Application No. 2009-258927, filed on Nov. 12, 2009, the contents of which are hereby incorporated by reference.

TECHNICAL FIELD

The present invention relates to a method of manufacturing a gallium nitride-based compound semiconductor and to a semiconductor light-emitting device fabricated according to the manufacturing method.

BACKGROUND ART

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors") have been researched and developed particularly extensively. As a result, blue light-emitting diodes (LEDs), green LEDs, and semiconductor laser diodes made of GaN-based semiconductors have already been used in actual products.

A gallium nitride-based semiconductor has a wurtzite crystal structure. FIG. 1 schematically illustrates a unit cell of GaN. In an $Al_aGa_bIn_cN$ (where $0 \leq a, b, c \leq 1$ and $a+b+c=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane", respectively.

The wurtzite crystal structure has other typical crystallographic plane orientations than the c-plane, as shown in FIG. 3. FIG. 3(a) shows a (0001) plane. FIG. 3(b) shows a (10-10) plane. FIG. 3(c) shows a (11-20) plane. FIG. 3(d) shows a (10-12) plane. As used herein, "-" attached on the left-hand side of a Miller-Bravais index in the parentheses means a "bar" (a negative direction index). The (0001) plane, the (10-10) plane, the (11-20) plane, and the (10-12) plane are the c-plane, the m-plane, the a-plane, and the r-plane, respectively. The m-plane and the a-plane are "non-polar planes" that are parallel to the c-axis, and the r-plane is a "semi-polar plane". Note that the "m-plane" is a generic term that collectively refers to a family of planes including (10-10), (−1010), (1-100), (−1100), (01-10) and (0-110) planes.

For years, a light-emitting device in which a gallium nitride-based compound semiconductor is used is fabricated by means of "c-plane growth". As used herein, the "X-plane growth" means epitaxial growth that is produced perpendicularly to the X plane (where X=c, m, a, or r) of a hexagonal wurtzite structure. As for the X-plane growth, the X plane will be sometimes referred to herein as a "growing plane". Furthermore, a layer of semiconductor crystals that have been formed as a result of the X-plane growth will be sometimes referred to herein as an "X-plane semiconductor layer".

When a light-emitting device is fabricated using a semiconductor multilayer structure formed by means of the c-plane growth, spontaneous polarization occurs in the −c direction due to a shift in the c-axis direction between the positions of a Ga atom and a N atom on the c-plane. On the other hand, in an InGaN quantum well layer used in a light-emitting layer, a piezoelectric polarization occurs in the +c direction due to strain, and a quantum confinement Stark effect of carriers occurs. Therefore, it is called a "polar plane". This effect reduces the probability of radiative recombination of carriers in the emission section and accordingly reduces the internal quantum yield. In the case of a semiconductor laser device, the threshold current increases. In the case of an LED, an increase in power consumption or a decrease in emission efficiency is caused. Meanwhile, as the density of injected carriers increases, screening of the piezoelectric field occurs, and a variation in emission wavelength also occurs.

In view of such circumstances, in recent years, intensive research has been carried out on growth of a gallium nitride-based compound semiconductor on a non-polar plane, such as m-plane and a-plane, and a semi-polar plane, such as r-plane. If a non-polar plane is available as the growing plane, no polarization occurs in the layer thickness direction (crystal growth direction) of the emission section. Therefore, the quantum confinement Stark effect does not occur. Thus, a light-emitting device which potentially has high efficiency can be fabricated. Even when the growing plane is a semi-polar plane, the influence of the quantum confinement Stark effect can be greatly reduced.

Patent Document 1 discloses the method of obtaining the optimum growth conditions for an $In_xGa_{1-x}N$ ($0<x<1$) layer based on the mole fraction of a source gas containing In (In supply mole fraction) and the diagram of the characteristic of the temperature employed for crystal growth (growth temperature) and the emission wavelength. A drawing of Patent Document 1 shows a graph where the abscissa axis represents the mole fraction of the In source gas with respect to the Group III source gas, and the ordinate axis represents the emission wavelength. This graph shows a characteristic curve in which the growth temperature is considered.

CITATION LIST

Patent Literature

Patent Document 1: Japanese Laid-Open Patent Publication No. 11-8407
Patent Document 2: Japanese PCT National Phase Laid-Open Publication No. 2007-537600

SUMMARY OF INVENTION

Technical Problem

Patent Document 1 discloses a method of determining the optimum conditions for the c-plane growth of an $In_xGa_{1-x}N$ ($0<x<1$) layer. However, the method as disclosed in Patent Document 1 cannot be applied to crystal growth of a non-polar m- or a-plane or a semi-polar r-plane. Thus, a growth condition optimization method which is applicable to a non-polar m- or a-plane or a semi-polar r-plane is unknown.

The present inventors conclude that the reason why the prior art method which is effective for the c-plane growth is not applicable to crystal growth of a non-polar plane or a semi-polar plane is that non-polar and semi-polar crystal growth includes a different mechanism of growth from that of the c-plane growth of the prior art. For example, there is a problem that, when m-plane growth of an InGaN layer is performed by metalorganic chemical vapor deposition (MOCVD), In atoms are not smoothly incorporated into the crystal of InGaN as described in Patent Document 2. Thus, when m-plane growth of the $In_xGa_{1-x}N$ (0<x<1) crystal is performed, it is difficult to increase the mole fraction of In, which is represented by "x".

The present invention was conceived for the purpose of solving the above problem. One of the objects of the present invention is to provide a method of crystal growth except for c-plane growth, in which the crystallinity and the emission efficiency of InGaN are improved.

Solution to Problem

A gallium nitride-based compound semiconductor light-emitting device fabrication method of the present invention is a method of fabricating a gallium nitride-based compound semiconductor light-emitting device, including forming a gallium nitride-based compound semiconductor layer whose principal surface is a non-polar plane or a semi-polar plane by metalorganic chemical vapor deposition, where parameters that define growth conditions of the metalorganic chemical vapor deposition include a pressure, a growth rate, a growth temperature, and an In supply mole fraction that is a mole fraction of an In source gas contained in a supplied Group III source gas, the method including the steps of: (A) determining a growth condition which corresponds to a saturation point, the saturation point being on a curve that represents a relationship between the growth temperature and the In supply mole fraction for formation of an $In_xGa_{1-x}N$ (0<x<1) layer of an identical emission wavelength in a case where the pressure and the growth rate are constant, and the saturation point being between a region where the growth temperature monotonically increases according to an increase of the In supply mole fraction and a region where the growth temperature saturates; and (B) growing an $In_xGa_{1-x}N$ (0<x<1) layer whose principal surface is a non-polar plane or a semi-polar plane under the determined growth condition.

In a preferred embodiment, step (A) includes (a1) forming a plurality of $In_yGa_{1-y}N$ (0<y<1) layers whose principal surface is a non-polar plane or a semi-polar plane by metalorganic chemical vapor deposition under different growth conditions; (a2) determining a relationship between the growth temperature and the In supply mole fraction in a case where the pressure and the growth rate are constant based on a growth condition employed for formation of $In_xGa_{1-x}N$ (0<x<1) layers whose emission wavelengths are equal among the plurality of $In_yGa_{1-y}N$ (0<y<1) layers; and (a3) determining a saturation point on a curve which represents the relationship between the growth temperature and the In supply mole fraction, the saturation point being between a region where the growth temperature monotonically increases according to an increase of the In supply mole fraction and a region where the growth temperature saturates.

In a preferred embodiment, step (a2) includes determining, for each of different combinations of the pressure and the growth rate, a relationship between the growth temperature and the In supply mole fraction in a case where the pressure and the growth rate are constant.

In a preferred embodiment, the $In_xGa_{1-x}N$ (0<x<1) layer is a well layer included in a single quantum well light-emitting layer or a multi-quantum well light-emitting layer.

In a preferred embodiment, a thickness of the well layer is not less than 2 nm and not more than 20 nm.

In a preferred embodiment, a thickness of the well layer is not less than 6 nm and not more than 16 nm.

In a preferred embodiment, step (B) includes (b1) regulating a growth pressure so as to be in a range from 200 Torr to 600 Torr, and step (B) includes growing an $In_xGa_{1-x}N$ (0<x<1) layer with a growth temperature and an In supply mole fraction which correspond to a saturation point on a curve that represents a relationship between the growth temperature and the In supply mole fraction which is obtained for the regulated growth pressure and the selected growth rate.

In a preferred embodiment, step (B) includes (b1) regulating a growth pressure so as to be an atmospheric pressure; and step (B) includes growing an $In_xGa_{1-x}N$ (0<x<1) layer with a growth temperature and an In supply mole fraction which correspond to a saturation point on a curve that represents a relationship between the growth temperature and the In supply mole fraction which is obtained for the regulated growth pressure and the selected growth rate.

A gallium nitride-based compound semiconductor layer growth condition determination method of the present invention is a gallium nitride-based compound semiconductor layer growth condition determination method for determining a condition for growing a gallium nitride-based compound semiconductor layer whose principal surface is a non-polar plane or a semi-polar plane by metalorganic chemical vapor deposition, where parameters that define growth conditions of the metalorganic chemical vapor deposition include a pressure, a growth rate, a growth temperature, and an In supply mole fraction that is a mole fraction of an In source gas contained in a supplied Group III source gas, the method comprising the steps of: (a1) forming a plurality of $In_yGa_{1-y}N$ (0<y<1) layers whose principal surface is a non-polar plane or a semi-polar plane by metalorganic chemical vapor deposition under different growth conditions; (a2) determining a relationship between the growth temperature and the In supply mole fraction in a case where the pressure and the growth rate are constant based on a growth condition employed for formation of $In_xGa_{1-x}N$ (0<x<1) layers whose emission wavelengths are equal among the plurality of $In_yGa_{1-y}N$ (0<y<1) layers; and (a3) determining a saturation point on a curve which represents the relationship between the growth temperature and the In supply mole fraction, the saturation point being between a region where the growth temperature monotonically increases according to an increase of the In supply mole fraction and a region where the growth temperature saturates.

In a preferred embodiment, step (a1) and step (a2) include forming a first $In_{x1}Ga_{1-x1}N$ (0<x1<1) layer with a first In supply mole fraction, forming a second $In_{x2}Ga_{1-x2}N$ (0<x2<1) layer with a second In supply mole fraction at a growth temperature which is equal to a growth temperature employed for formation of the first $In_{x1}Ga_{1-x1}N$ (0<x1<1) layer, the second In supply mole fraction being lower than the first In supply mole fraction, and forming a third $In_{x3}Ga_{1-x3}N$ (0<x3<1) layer with a third In supply mole fraction at a growth temperature which is equal to the growth temperature for formation of the first $In_{x1}Ga_{1-x1}N$ (0<x1<1) layer, the third In supply mole fraction being lower than the second In supply mole fraction.

In a preferred embodiment, in step (a3), when x2 is equal to x1 and x3 is different from x2, the third In supply mole fraction is selected as an In supply mole fraction that corresponds to a saturation point.

Advantageous Effects of Invention

According to the present invention, in growing an $In_xGa_{1-x}N$ crystal (0<x<1) which has an intended emission wavelength in the direction of a non-polar plane or a semi-polar plane, the parameters for the crystal growth conditions, including the growth temperature and the mole fraction of the In source gas, can be appropriately determined. Therefore, it is possible to form an $In_xGa_{1-x}N$ crystal ($0<x<1$) which exhibits a high emission efficiency at the intended emission wavelength.

DESCRIPTION OF EMBODIMENTS

Figure 1:
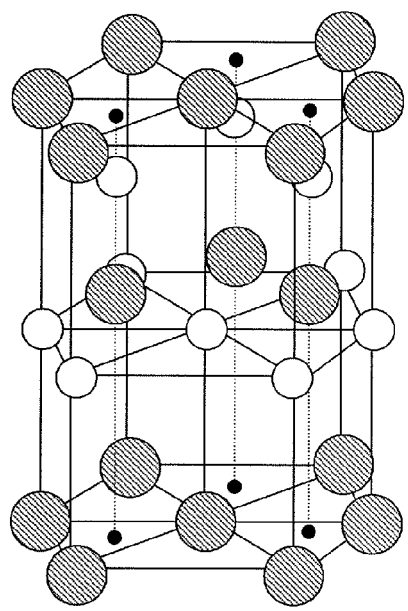
FIG. 1 is a perspective view schematically illustrating a unit cell of GaN.
Figure 1:
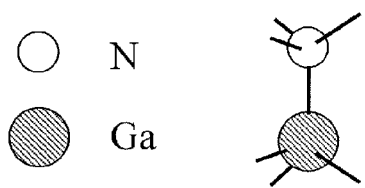

A method of fabricating a gallium nitride-based compound semiconductor light-emitting device of the present embodiment includes the step of forming a gallium nitride-based compound semiconductor layer whose principal surface is a non-polar plane (e.g., m- or a-plane) or a semi-polar plane (e.g., r-plane) by metalorganic chemical vapor deposition. According to the present embodiment, the parameters which define the growth conditions of the metalorganic chemical vapor deposition are regulated for forming a gallium nitride-based compound semiconductor layer which emits at an intended wavelength. Here, the parameters which define the growth conditions include "pressure", "growth rate", "growth temperature", and "mole fraction of In source gas contained in supplied Group III source gas (In supply mole fraction)".

According to the present embodiment, the step of supplying a source gas into a reactor of a MOCVD apparatus is performed to promote crystal growth of an $In_xGa_{1-x}N$ ($0<x<1$) layer whose principal surface has an plane orientation in which the In incorporation efficiency is lower than in the c-plane. Specific examples of the crystallographic plane in which the In incorporation efficiency is lower than in the c-plane include m-plane, a-plane, and r-plane. Hereinafter, for the sake of simplicity, the present embodiment is described with an example of the m-plane growth. The present embodiment is not limited to the m-plane growth but is widely applicable to formation of an $In_xGa_{1-x}N$ ($0<x<1$) layer that has a crystallographic plane in which the In incorporation efficiency is lower than in the c-plane. In the crystal growth step of the $In_xGa_{1-x}N$ ($0<x<1$) layer, a source gas which contains In, a source gas which contains Ga, and a source gas which contains N are supplied into the reactor. The source gas which contains In and the source gas which contains Ga are Group III source gases. On the other hand, the source gas which contains N is a Group V source gas. To realize an intended emission wavelength, it is necessary to regulate the mole fraction of In, x, in the $In_xGa_{1-x}N$ ($0<x<1$) layer so as to be an intended value. To this end, according to the present embodiment, the above-described crystal growth step includes regulating the conditions of the preset "pressure" and "growth rate" as well as "growth temperature" and "mole fraction of In source gas contained in supplied Group III source gas". For the sake of simplicity, in this specification, "mole fraction of In source gas contained in supplied Group III source gas" is referred to as "In supply mole fraction".

More specifically, the "In supply mole fraction" is defined based on the molar supply flow rates (mol/min), i.e., the molar amounts per minute, of the source gases of the Group III elements, Ga and In, which are supplied into the reactor during the growth of the $In_xGa_{1-x}N$ (0<x<1) layer. In this specification, the "In supply mole fraction" or "the mole fraction of a gas containing In" refers to the ratio of the molar supply flow rate of the In source gas to the total molar supply flow rate of the In source gas and the Ga source gas which are supplied into the reactor. Therefore, the "In supply mole fraction" or "the mole fraction of a gas containing In" is expressed by the following formula:

[Expression 1]

[Supplied In source gas]/[Supplied In source gas]+
    [Supplied Ga source gas]     (Formula 1)

where [Supplied Ga source gas] is the molar supply flow rate (mol/min), i.e., the molar amount per minute, of the Ga source gas, and [Supplied In source gas] is the molar supply flow rate (mol/min), i.e., the molar amount per minute, of the In source gas.

The In source gas may be, for example, trimethylindium (TMI). [Supplied In source gas] is also expressed as [TMI]. The Ga source gas may be, for example, trimethylgallium (TMG) or triethylgallium (TEG). [Supplied Ga source gas] is also expressed as [TMG] or [TEG]. Here, [TMI] is the molar supply flow rate (mol/min), i.e., the molar amount per minute, of TMI. [TMG] is the molar supply flow rate (mol/min), i.e., the molar amount per minute, of TMG. [TEG] is the molar supply flow rate (mol/min), i.e., the molar amount per minute, of TEG.

In this specification, for the sake of simplicity, [Supplied In source gas] is expressed as [TMI], and the Ga supply flow rate is expressed as [TMG]. Therefore, the "In supply mole fraction" is expressed by Formula 2 shown below.

[Expression 2]

$[TMI]/([TMI]+[TMG])$     (Formula 2)

In general, when the $In_xGa_{1-x}N$ (0<x<1) layer is grown by MOCVD, it is difficult to measure the actual amount of supplied In or the actual In partial pressure which contributes to an actual reaction. Therefore, in this specification, the molar flow rate of the source gas supplied into the reactor is assigned as one of the control factors of the In incorporation efficiency. More specifically, "pressure", "growth temperature", "In supply mole fraction", and "growth rate" are assigned as the control factors of the In fraction x of the $In_xGa_{1-x}N$ (0<x<1) layer.

As shown above in Formula 2, the "In supply mole fraction" is expressed by [TMI] and [TMG]. On the other hand, the growth rate is substantially determined depending on [TMG].

According to the present embodiment, under different growth conditions, a plurality of $In_yGa_{1-y}N$ (0<y<1) layers whose principal surface is a non-polar plane or a semi-polar plane are formed. Based on the growth condition employed for formation of $In_xGa_{1-x}N$ (0<x<1) layers whose emission wavelengths are equal among the plurality of $In_yGa_{1-y}N$ (0<y<1) layers, the relationship between the growth temperature and the In supply mole fraction in a case where the pressure and the growth rate are constant is determined. The relationship between the "growth temperature" and the "In supply mole fraction" in a case where the pressure and the growth rate are constant can be preferably expressed by a curve (including a chain of line segments) in a graph where the ordinate axis represents the "growth temperature" and the abscissa axis represents the "In supply mole fraction". In this specification, such a curve is sometimes referred to as "characteristic curve".

For a deeper understanding of the present embodiment, formation of an $In_xGa_{1-x}N$ (0<x<1) layer by means of the c-plane growth of the prior art is first described.

In general, the In mole fraction x in the $In_xGa_{1-x}N$ (0<x<1) layer varies depending on both the "growth temperature" and the "In supply mole fraction" of the $In_xGa_{1-x}N$ layer. In other words, the In mole fraction x in the $In_xGa_{1-x}N$ (0<x<1) layer varies as the "growth temperature" varies even when the "In supply mole fraction" is constant. Also, the In mole fraction x in the growing $In_xGa_{1-x}N$ (0<x<1) layer varies as the "In supply mole fraction" varies even when the "growth temperature" is constant. Since the emission wavelength is determined depending on the In mole fraction x, it is necessary to determine both the "growth temperature" and the "In supply mole fraction" in order to obtain an $In_xGa_{1-x}N$ (0<x<1) layer which emits at an intended wavelength.

Figure 4A:
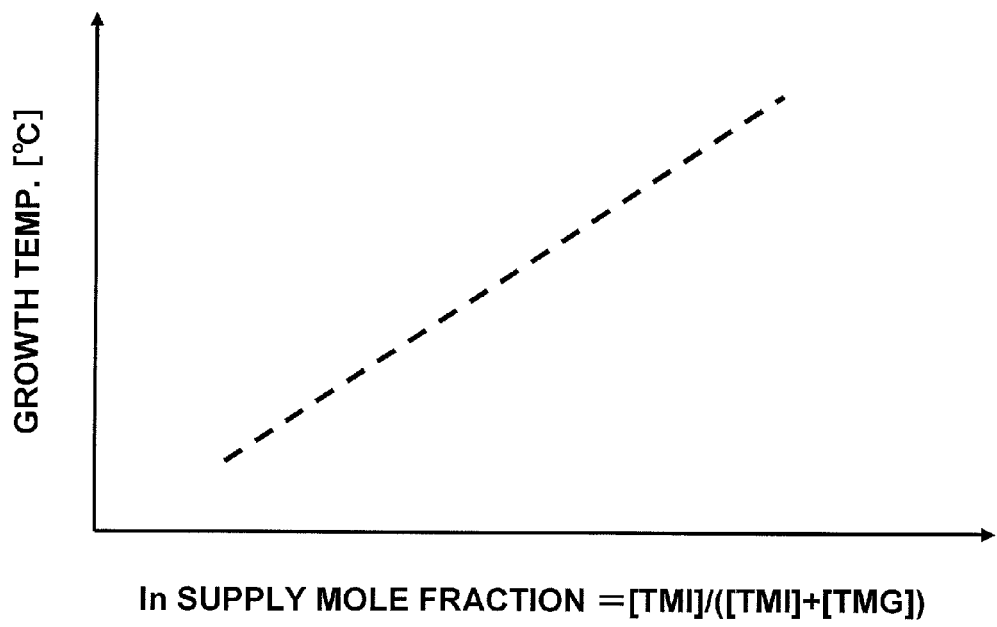
FIG. 4A is a graph schematically showing the relationship between the In supply mole fraction and the growth temperature for formation of an $In_xGa_{1-x}N$ ($0<x<1$) layer of an identical emission wavelength by means of the c-plane growth.

FIG. 4A shows the relationship between the "growth temperature" and the "In supply mole fraction" which are necessary for the c-plane growth of an $In_xGa_{1-x}N$ layer which has a certain In mole fraction x (e.g., x=0.1). As seen from FIG. 4A, in the case of growing a c-plane $In_xGa_{1-x}N$ layer which has a certain In mole fraction x, increasing the "In supply mole fraction" leads to the necessity of increasing the "growth temperature". Thus, there is a linear relationship between the "growth temperature" and the "In supply mole fraction".

As described above, FIG. 4A shows, as an example, the relationship between the "growth temperature" and the "In supply mole fraction" which are necessary for the c-plane growth of an $In_{0.1}Ga_{0.9}N$ layer. Therefore, the $In_{0.1}Ga_{0.9}N$ layer (x=0.1) can be obtained by performing the c-plane growth of the $In_xGa_{1-x}N$ (0<x<1) layer with the "growth temperature" and the "In supply mole fraction" which are determined by a "point" on the straight line (broken line) shown in FIG. 4A. As the "growth temperature" and the "In supply mole fraction" are changed by sliding the "point" along the straight line (broken line) of FIG. 4A, $In_{0.1}Ga_{0.9}N$ layers of identical compositions (identical emission wavelengths) can be grown under different growth conditions. Thus, the In mole fraction x in the resultant $In_xGa_{1-x}N$ layers is constant without depending on the position of the point on the line.

Figure 4B:
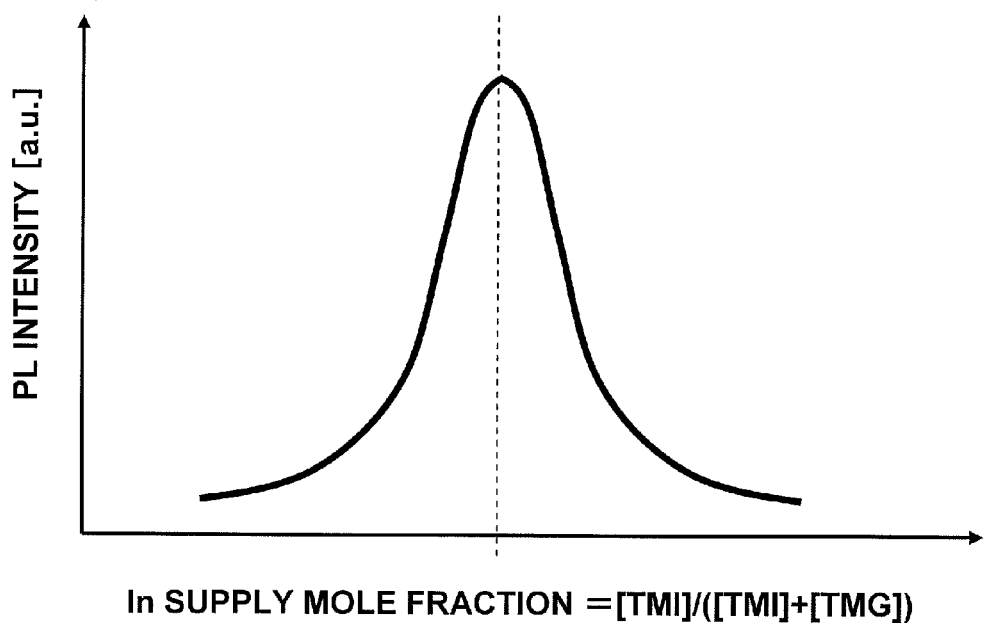
FIG. 4B is a graph schematically showing the relationship between the In supply mole fraction and the PL emission intensity for formation of an $In_xGa_{1-x}N$ ($0<x<1$) layer of an identical emission wavelength by means of the c-plane growth.

However, the PL emission intensity obtained from these $In_xGa_{1-x}N$ layers (e.g., $In_{0.1}Ga_{0.9}N$ layers) varies depending on the position of the "point" on the straight line (broken line). FIG. 4B is a graph showing the relationship between the In supply mole fraction and the PL emission intensity. It is seen from FIG. 4B that the PL emission intensity has the highest value (peak value) at a certain In supply mole fraction. Thus, the reason why the PL emission intensity varies depending on a certain In supply mole fraction is that the crystallinity varies depending on the "growth temperature" and the "In supply mole fraction" even when the In mole fraction x of the $In_xGa_{1-x}N$ (0<x<1) layer is constant. When the $In_xGa_{1-x}N$ (0<x<1) layer has the most excellent crystallinity, the PL emission intensity exhibits the highest value. Therefore, to form an $In_xGa_{1-x}N$ (0<x<1) layer which has excellent crystallinity by c-plane growth, only determining the relationship shown in FIG. 4A is insufficient, and it is necessary to determine the relationship between the In supply mole fraction and the PL emission intensity shown in FIG. 4B.

Figure 4C:
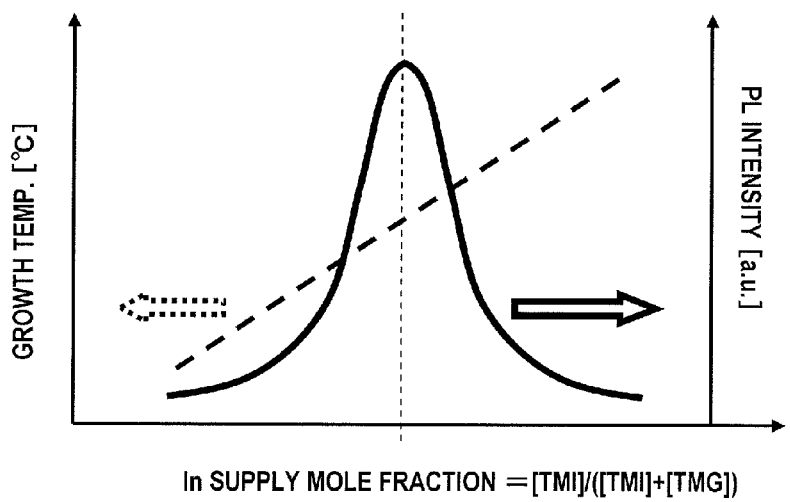
FIG. 4C is a graph schematically showing the In supply mole fraction dependences of the growth temperature and the PL emission intensity when an $In_xGa_{1-x}N$ ($0<x<1$) layer of an identical emission wavelength is formed by means of the c-plane growth.

FIG. 4C is a graph showing the straight line (broken line) of FIG. 4A, which represents the "In supply mole fraction" dependence of the "growth temperature", and the curve (solid line) of FIG. 4B, which represents the "In supply mole fraction" dependence of the "PL emission intensity".

The straight line and the curve shown in FIG. 4C may have different shapes according to an intended emission wavelength. Therefore, the graph of FIG. 4C needs to be experimentally determined for a desired emission wavelength. As described above, in the c-plane growth of the prior art, only experimentally determining the relationship between the "growth temperature" and the "In supply mole fraction" which are necessary for realizing an intended emission wavelength is insufficient. It is necessary to prepare a large number of samples which satisfy the thus-obtained relationship between the "growth temperature" and the "In supply mole fraction" and experimentally determine the "growth temperature" and the "In supply mole fraction" such that the PL emission intensity reaches the highest value.

The present inventors found that, in the case of forming a gallium nitride-based compound semiconductor layer whose principal surface is a non-polar plane or a semi-polar plane by MOCVD, there are a region where the growth temperature monotonically increases according to the increase of the In supply mole fraction (monotonic increase region) and a region where the growth temperature saturates (saturation region), in contrast to the c-plane growth of the prior art. On this characteristic curve, there is a "saturation point" between the monotonic increase region and the saturation region. The present inventors also found that, when an $In_xGa_{1-x}N$ ($0<x<1$) layer whose principal surface is a non-polar plane or a semi-polar plane is grown under the growth conditions corresponding to this saturation point, the resultant $In_xGa_{1-x}N$ ($0<x<1$) layer has excellent crystallinity and increased emission intensity.

Figure 5:
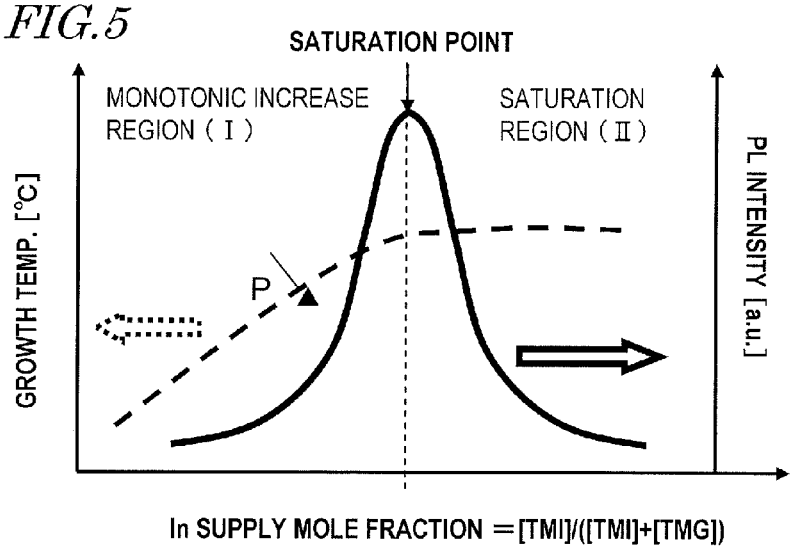
FIG. 5 is a graph schematically showing the In supply mole fraction dependences of the growth temperature and the PL emission intensity when an $In_xGa_{1-x}N$ ($0<x<1$) layer of an identical emission wavelength is formed by means of the m-plane growth.

FIG. 5 is a graph schematically showing an example of the conditions for formation of under which an m-plane $In_xGa_{1-x}N$ ($0<x<1$) layer is formed according to the present embodiment. This graph corresponds to FIG. 4C. In the graph, the ordinate axis on the left side represents the growth temperature, and the ordinate axis on the right side represents the PL emission intensity [arbitrary unit]. The broken line in the graph is a curve (characteristic curve) which represents the relationship between the In supply mole fraction and the growth temperature employed for formation of m-plane $In_xGa_{1-x}N$ ($0<x<1$) layers of equal emission wavelengths. The graph of FIG. 5 shows, as an example, the relationship between the In supply mole fraction and the growth temperature which are necessary for formation of an $In_xGa_{1-x}N$ ($x=0.1$) layer whose emission wavelength peak is about 410 nm. The In supply mole fraction which corresponds to Point P on the broken line of FIG. 5 is, for example, 0.5. The growth temperature which corresponds to Point P is about 770° C. Here, if the growth temperature deviates from a growth temperature corresponding to Point P while an In supply mole fraction corresponding to Point P is adopted, an intended $In_xGa_{1-x}N$ ($x=0.1$) layer cannot be grown, so that the In mole fraction x deviates from 0.1.

To realize an intended In mole fraction x, the two control factors, the In supply mole fraction and the growth temperature, need to be determined so as to satisfy the relationship of the characteristic curve. This characteristic curve also varies as the growth pressure varies. Also, it varies as the intended In mole fraction x varies. When the growth pressure and the intended In mole fraction x are determined, the shape of the characteristic curve is determinate.

According to the experiments conducted by the present inventors, in a range where the In supply mole fraction is relatively low, the growth temperature monotonically increases according to the increase of the In supply mole fraction. In a range where the In supply mole fraction is relatively high, the growth temperature exhibits generally constant values irrespective of the value of the In supply mole fraction. The former range is referred to as "monotonic increase region", and the latter is referred to as "saturation region". There is a saturation point at the boundary between the monotonic increase region and the saturation region. Such a shape of the characteristic curve is largely different from the shape of the characteristic curve of the c-plane growth.

Further, the present inventors experimentally found that, when the In supply mole fraction and the growth temperature correspond to the saturation point on the characteristic curve, the PL emission intensity exhibits a peak. Thus, when the In supply mole fraction and the growth temperature corresponding to the saturation point on the characteristic curve are found, the growth conditions which are necessary for maximizing the PL emission intensity can be determined. Therefore, if the saturation point on the characteristic curve is successfully detected, the experiment that is conducted for determining the conditions which maximize the PL emission intensity can be omitted.

On the other hand, in the case of the c-plane growth, the growth temperature monotonically increases according to the increase of the In supply mole fraction as shown in FIG. 4C and thus does not have a unique point which is associated with the peak of the PL emission intensity. Therefore, it is necessary to prepare a large number of samples which have an intended In mole fraction x while changing the In supply mole fraction and the growth temperature and thereafter measure the PL emission intensity of the samples. Before the actual PL emission intensity is measured, the In supply mole fraction dependence of the PL emission intensity which is expressed by the solid line in FIG. 4C cannot be known, and the In supply mole fraction and the growth temperature which maximize the PL emission intensity cannot be detected.

In the prior art, in the case of performing a c-plane growth process of an $In_xGa_{1-x}N$ ($0<x<1$) layer by MOCVD, the c-plane growth process is usually performed at as high a temperature as possible in order to prevent deterioration of crystallinity and decrease of the $NH_3$ decomposition efficiency. In that case, a larger proportion of In atoms are eliminated by evaporation, and In atoms are not smoothly incorporated into a crystal structure, and therefore, it is necessary to increase the In supply flow rate as much as possible. Also, as described above, in consideration of the Stark effect in the polar plane, the thickness of the active layer is preferably not more than 3.0 mn. To this end, it is also necessary to regulate the growth rate of the active layer so as to be not more than about 4.0 nm/min. Since the In mole fraction x is small in the visible light range, the growth rate of the active layer that is made of $In_xGa_{1-x}N$ ($0<x<1$) is determined based on the amount of supplied Ga atoms. Therefore, the growth rate of the $In_xGa_{1-x}N$ ($0<x<1$) layer can be expressed by a function of [TMG].

In the growth of a c-plane $In_xGa_{1-x}N$ ($0<x<1$) layer, [TMI] is increased as much as possible while the growth rate is set to a low rate, so that [TMG] is small. Thus, the In supply mole fraction (=[TMI]/([TMI]+[TMG])) is set to about 0.90 or larger.

On the other hand, in the growth of an m-plane $In_xGa_{1-x}N$ ($0<x<1$) layer, the In incorporation efficiency is lower than in the c-plane growth. Even when it is attempted to further increase the In supply mole fraction (=[TMI]/([TMI]+[TMG])) for the purpose of increasing the In mole fraction x, there is only a small room for the increase because the In supply mole fraction is already about 0.90 as described above, and therefore, the effect of the increase would be smaller than what is expected. Thus, in the case of m-plane growth, it is very difficult to realize an $In_xGa_{1-x}N$ (0<x<1) layer which emits at a longer wavelength side on which the In mole fraction is high.

In the case of m-plane growth, the Stark effect would not occur as described above. Therefore, the thickness of the active layer can be increased so as to be greater than nm, e.g., can be increased to about 20 nm. Thus, the growth rate can be increased to 4.5 nm/min or higher, so that the crystal growth can be realized at a growth rate which is significantly higher than the growth rate of the c-plane growth. From the experiments conducted by the present inventors, it was found that, in the case of m-plane growth, when the growth rate is increased, the In incorporation efficiency increases. Therefore, in the case of m-plane growth, when [TMG] is increased for the purpose of increasing the In incorporation efficiency, the In supply mole fraction (=[TMI]/([TMI]+[TMG])) becomes smaller than in the c-plane growth.

Thus, in the case of m-plane growth, growth of an $In_xGa_{1-x}N$ (0<x<1) layer can be performed at a higher growth rate than in the c-plane growth. Further, in the case of m-plane growth, the In incorporation efficiency heavily depends on [TMG] and [TMI] as compared with the case of c-plane growth. Therefore, it is expected that the In incorporation efficiency in the m-plane growth can be regulated not only based on the control factors, such as the growth temperature, but also based on the In supply mole fraction (=[TMI]/([TMI]+[TMG])). This is not limited to the case of m-plane growth but similarly applies to a-plane growth and r-plane growth.

Figure 6:
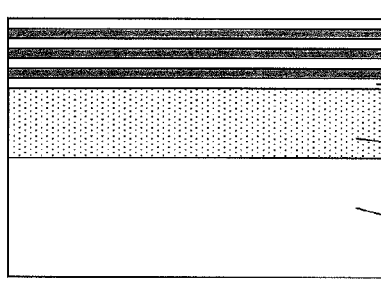
FIG. 6 is a cross-sectional view schematically showing the configuration of a gallium nitride-based compound semiconductor light-emitting device for evaluation in Embodiments 1 to 3 of the present invention.

FIG. 6 schematically shows a cross-sectional structure of a sample (light-emitting device 10) used for obtaining the characteristic curve shown in FIG. 5.

The light-emitting device 10 includes a substrate 11 on which (10-10) m-plane gallium nitride (GaN) can be grown. The most desirable example of the substrate 11 is a freestanding GaN substrate whose principal surface is an m-plane. However, the substrate 11 may be a substrate of silicon carbide (SiC) whose lattice constant is close to that of gallium nitride and which has a 4H or 6H structure with an m-plane principal surface. Alternatively, a sapphire substrate that has an m-plane principal surface may be used. However, if a material that is different from the gallium nitride-based compound semiconductor is used for the substrate, an appropriate spacer layer or buffer layer is inserted between the substrate and a gallium nitride-based compound semiconductor layer which is to be deposited thereon.

Provided on the substrate 11 is an undoped GaN underlayer (GaN layer) 12 which has a thickness of about 1.0 to 2.0 μm. Over the underlayer 12, a light-emitting layer 15 of a multi-quantum well structure (MQW) is provided, which alternately includes undoped GaN barrier layers 13, each having a thickness of about 30 nm, and $In_{0.1}Ga_{0.9}N$ well layers (active layers) 14, each having a thickness of about 15 nm. The light-emitting device 10 used in this experiment includes a light-emitting layer 15 of a 3-cycle multi-quantum well structure which includes four GaN barrier layers 13 and three active layers 14.

In general, the thickness of the $In_{0.1}Ga_{0.9}N$ well layer (active layer) 14 is about 2.0 to 20 nm in the case of a non-polar or semi-polar plane. A preferred thickness of the well layer 14 is about 6.0 to 1 nm. In the experiment, the well layer 14 employed had a thickness of about 15 nm. However, the well layer 14 may have a different thickness. The thickness of the barrier layer 13 is about 1.0 to 3.0 times the thickness of the active layer. In this experiment, the barrier layer 13 used had a thickness of 30 nm. However, the same results would be obtained even when the thickness of the barrier layer 13 is changed.

Next, a method of fabricating the light-emitting device 10 is described.

The light-emitting device 10 was fabricated by vapor deposition based on MOCVD. The growth pressure of the reactor was set to 300 Torr. The carrier gases used were hydrogen ($H_2$) and nitrogen ($N_2$). The Group III source gases used were trimethylgallium (TMG) and trimethylindium (TMI). The Group V source gas used was ammonium ($NH_3$).

Firstly, the substrate 11 is washed with a buffered hydrofluoric acid solution (BHF) and is thereafter sufficiently washed with water and dried. After having been washed, the substrate 11 is placed in a reactor of a MOCVD apparatus in such a manner that the substrate 11 is kept away from air as much as possible. Thereafter, the substrate 11 is heated to 850° C. while ammonium ($NH_3$) is supplied as the nitrogen source and hydrogen ($H_2$) and nitrogen ($N_2$) are supplied as the carrier gases, whereby the substrate surface is cleaned. Then, TMG or TEG is supplied, and the substrate is heated to about 1100° C., whereby a GaN layer 12 is deposited. Deposition of this GaN layer 12 is carried out with the growth rate of about 10 to 40 nm/min.

Then, the supply of the Group III source gas, TMG, is stopped while the supply of hydrogen is stopped so that only the nitrogen gas is supplied as the carrier gas. The substrate temperature is decreased to about 700 to 800° C., so that a GaN barrier layer 13 is deposited. Then, supply of TMI is started, whereby an $In_xGa_{1-x}N$ (0<x<1) well layer 14 is deposited. The GaN barrier layer 13 and the $In_xGa_{1-x}N$ (0<x<1) well layer 14 are alternately deposited in three or more cycles, whereby a GaN/InGaN multi-quantum well light-emitting layer 15, which will function as the emission section, is formed. The reason for the three or more cycles is that, as the number of $In_xGa_{1-x}N$ (0<x<1) well layers 14 increases, the volume for capturing carriers that contribute to radiative recombination increases, so that the emission efficiency of the device improves.

Then, the method of measuring the "growth temperature" in this experiment is described.

There is a carbon susceptor placed in the reactor of the MOCVD apparatus. The substrate 11 is directly placed on the carbon susceptor. A thermocouple for measuring the growth temperature is installed immediately below the carbon susceptor so as to be enclosed by an electric heater. In this specification, the growth temperature refers to a temperature measured by the thermocouple.

A gallium nitride-based compound semiconductor fabrication method of the present embodiment may be suitably implemented with an apparatus which is different from the apparatus used by the present inventors. Also, in implementing the fabrication method of the present embodiment, the method of heating the substrate and the method of measuring the substrate temperature are not limited to the above-described methods.

EMBODIMENT 1

Figure 7:
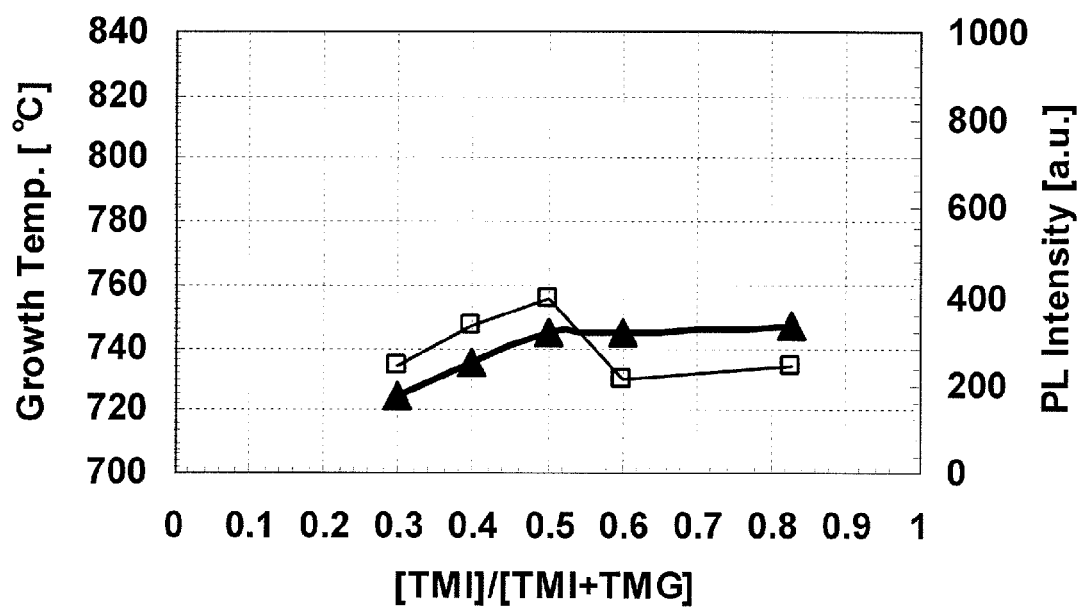
FIG. 7 is a graph showing the In supply mole fraction dependences of the growth temperature (▲) and the emission intensity (□) in Embodiment 1.

FIG. 7 is a graph showing a characteristic curve for formation of an m-plane $In_{0.1}Ga_{0.9}N$ well layer 14 whose emission wavelength is about 410 nm±5 nm.

This characteristic curve (a line connecting five solid triangles (▲)) represents the relationship between the In supply mole fraction and the growth temperature which was obtained under the conditions that the pressure was 300 Torr and the growth rate was about 6.0 nm/min. The intended emission wavelength is about 410 nm±5 nm. For the respective values of the In supply mole fraction, 0.30, 0.40, 0.50, 0.60, and 0.83, the values of the growth temperature required for obtaining an $In_{0.1}Ga_{0.9}N$ well layer 14 which achieves the emission wavelength of about 410 nm±5 nm are indicated by solid triangles (▲) in FIG. 7.

In the graph of FIG. 7, the ordinate axis on the right side represents the PL emission intensity (□) obtained by performing photoluminescence (PL) measurement on samples of the light-emitting device 10 which were prepared under five different conditions.

The values of the data of points ▲ and □ of FIG. 7 are shown in Table 1.

TABLE 1

| Growth temperature | 725° C. | 735° C. | 745° C. | 745° C. | 745° C. |
|---|---|---|---|---|---|
| In supply mole fraction | 0.30 | 0.40 | 0.50 | 0.60 | 0.83 |
| Peak wavelength (nm) | 407 | 406 | 405 | 412 | 408 |
| PL intensity (a.u.) | 243.3 | 338.3 | 399.1 | 213.7 | 244.8 |

It is seen from the characteristic curve shown in FIG. 7 that the relationship between the growth temperature and the In supply mole fraction changes near a position where the In supply mole fraction is 0.50. In the range where the In supply mole fraction is not more than 0.50, a larger proportion of In atoms are eliminated as the growth temperature increases. To compensate for the eliminated In atoms, it is necessary to increase the In supply mole fraction. In this range, by increasing both the In supply mole fraction and the growth temperature, an In mole fraction of an identical emission wavelength can be realized. In other words, the growth temperature monotonically increases according to the increase of the In supply mole fraction.

On the other hand, in the range where the In supply mole fraction is not less than 0.50, when the growth temperature is further increased, elimination of In atoms is promoted to a level such that the eliminated In atoms cannot be compensated for by increasing the In supply mole fraction. As a result, the emission wavelength becomes shorter than the intended value. In other words, in this range, the growth temperature has an upper limit. In this range, even when the In supply mole fraction is further increased, the amount of In atoms incorporated in the crystal would not change. This phenomenon is also expected to occur in the case of a plane orientation in which incorporation of In atoms is more difficult than in the case of c-plane growth due to a low In incorporation efficiency.

It is seen from FIG. 7 that, in the monotonic increase region, as the In supply mole fraction increases, the PL emission intensity also increases. In the case of an $In_xGa_{1-x}N$ (0<x<1) layer, elimination of In atoms occurs more frequently as the growth temperature increases. Thus, it is inferred that, in the monotonic increase region, as the In supply mole fraction and the growth temperature increase, formation of a non-emission center, such as a point defect, is prevented, so that the emission efficiency improves.

Figure 8:
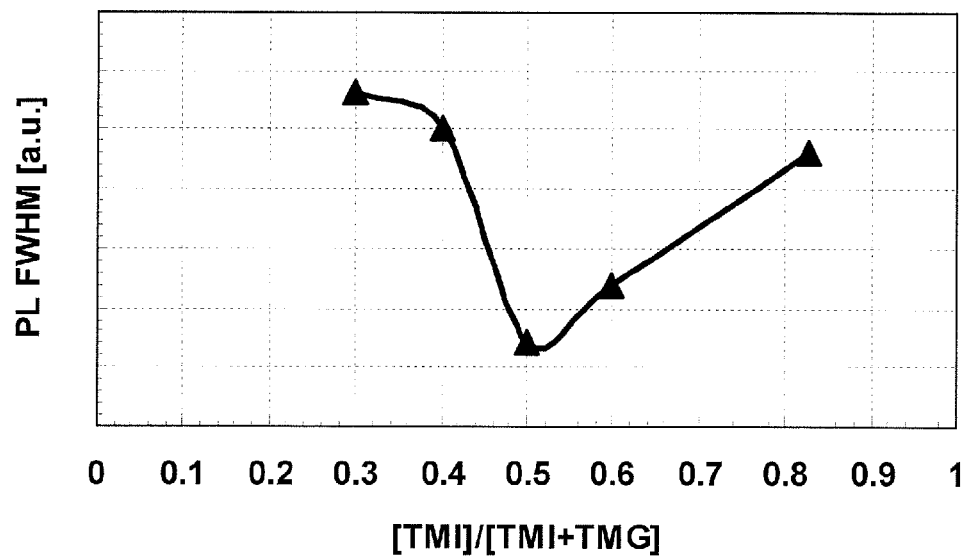
FIG. 8 is a graph showing the In supply mole fraction dependence of the full width half maximum (FWHM) in the PL spectrum of Embodiment 1.

FIG. 8 is a graph in which full width half maximum (FWHM) obtained from the PL intensity spectrum of the present embodiment are plotted. It is seen from this graph that the PL intensity spectrum is sharp at the saturation point but broad at the other points than the saturation point. The reason why the PL emission intensity spectrum becomes broad is that the $In_{0.1}Ga_{0.9}N$ well layer 14 has deteriorated crystallinity.

Again, refer to FIG. 7. In the saturation region, the PL intensity decreases according to the increase of the In supply mole fraction. In this saturation region, the growth temperature is generally constant, and therefore, the degree of elimination of In atoms is constant even when the In supply mole fraction is increased. Therefore, it is unreasonable to conclude that formation of a non-emission center, such as a point defect, during growth of an $In_xGa_{1-x}N$ (0<x<1) layer is a cause of the decrease of the PL intensity.

As seen from FIG. 8, in the saturation region, the full width half maximum (FWHM) of the PL intensity spectrum increases as the In supply mole fraction increases. In the saturation region, the amount of In atoms in the reactor is excessive so that segregation of In atoms occurs in the $In_xGa_{1-x}N$ (0<x<1) layer. This is probably one of the causes that degrade the crystallinity.

EMBODIMENT 2

Figure 9:
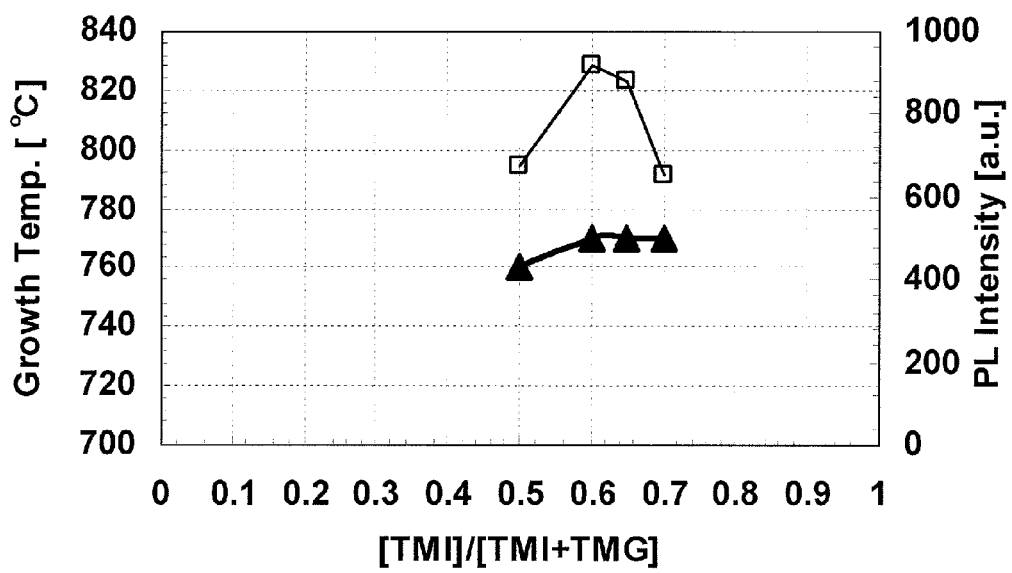
FIG. 9 is a graph showing the In supply mole fraction dependences of the growth temperature (▲) and the emission intensity (□) in Embodiment 2.

FIG. 9 shows the relationship between the In supply mole fraction and the growth temperature which was obtained under the condition that the growth rate was about 12.0 nm/min. The intended emission wavelength is about 410 nm±5 nm, which is equal to the value of Embodiment 1. For the respective values of the In supply mole fraction, 0.50, 0.60, 0.65, and 0.70, the values of the growth temperature required for obtaining an m-plane $In_{0.1}Ga_{0.9}N$ well layer 14 which achieves the emission wavelength of about 410 nm±5 nm are indicated by solid triangles (▲) in FIG. 9. The values of the PL emission intensity of the well layers of the $In_{0.1}Ga_{0.9}N$ well layers 14 which were formed with the values of the In supply mole fraction and the growth temperature indicated by the solid triangles (▲) are indicated by open boxes (□) in the graph of FIG. 9.

The values of the data of points ▲ and □ of FIG. 9 are shown in Table 2.

TABLE 2

| Growth temperature | 760° C. | 770° C. | 770° C. | 770° C. |
|---|---|---|---|---|
| In supply mole fraction | 0.50 | 0.60 | 0.65 | 0.70 |
| Peak wavelength (nm) | 397 | 395 | 398 | 403 |
| PL intensity (a.u.) | 672.6 | 915.3 | 878.1 | 654.2 |

It is seen from the graph of FIG. 9 that the saturation point exists near a position where the In supply mole fraction is 0.60. Also in the present embodiment, the PL intensity exhibits a peak value near the saturation point, and the full width half maximum (FWHM) of the PL spectrum is smallest.

The difference between Embodiment 1 and Embodiment 2 is that the growth rate in Embodiment 2 is higher than the growth rate in Embodiment 1. In this embodiment, due to the higher growth rate, the In incorporation efficiency improves. Therefore, in this embodiment, the growth temperature in the saturation region is higher than the growth temperature of the saturation region in Embodiment 1. As the growth rate increases, the In supply mole fraction of the saturation point increases.

EMBODIMENT 3

Figure 10:
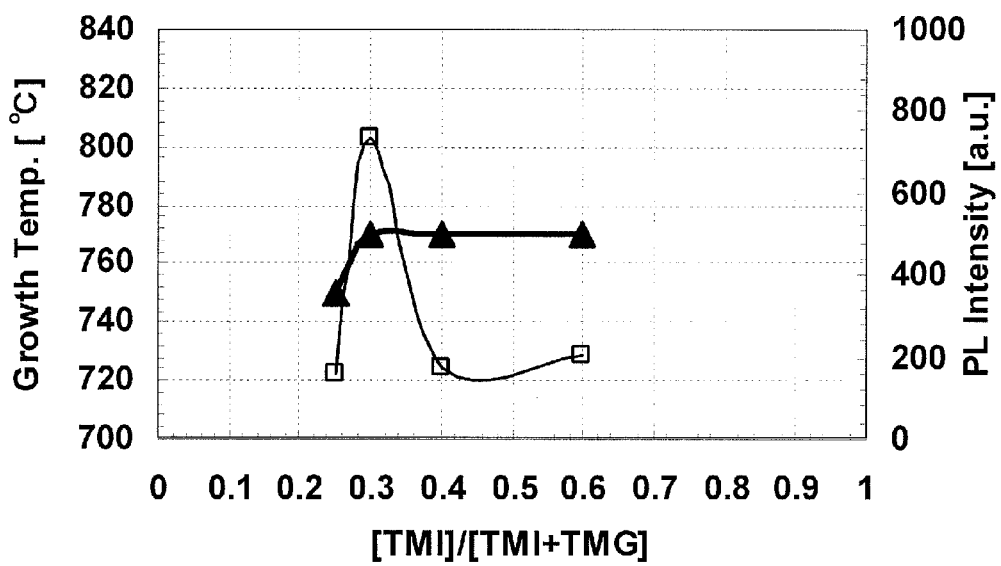
FIG. 10 is a graph showing the In supply mole fraction dependences of the growth temperature (▲) and the emission intensity (□) in Embodiment 3.

FIG. 10 shows the relationship between the In supply mole fraction and the growth temperature which was obtained under the conditions that the pressure was 500 Torr and the growth rate was about 12.0 nm/min. The intended emission wavelength is about 410 nm±5 nm, which is equal to the values of Embodiments 1 and 2. For the respective values of the In supply mole fraction, 0.25, 0.30, 0.40, and 0.60, the values of the growth temperature required for obtaining an m-plane $In_{0.1}Ga_{0.9}N$ well layer 14 which achieves the emission wavelength of about 410 nm±5 nm are indicated by solid triangles (▲) in FIG. 10. The values of the PL emission intensity of the well layers of the $In_{0.1}Ga_{0.9}N$ well layers 14 which were formed with the values of the In supply mole fraction and the growth temperature indicated by the solid triangles (▲) are indicated by open boxes (□) in the graph of FIG. 10.

The data of points ▲ and □ in FIG. 10 are shown in Table 3.

TABLE 3

| Growth temperature | 750° C. | 770° C. | 770° C. | 770° C. |
|---|---|---|---|---|
| In supply mole fraction | 0.25 | 0.30 | 0.40 | 0.60 |
| Peak wavelength (nm) | 395 | 398 | 404 | 401 |
| PL intensity (a.u.) | 157.1 | 738.3 | 170.7 | 207.1 |

It is seen from the graph of FIG. 10 that the saturation point exists near a position where the In supply mole fraction is 0.30. Also in the present embodiment, the PL intensity exhibits a peak value near the saturation point, and the full width half maximum (FWHM) of the PL spectrum is smallest.

Although the growth rate in Embodiment 3 is equal to the growth rate in Embodiment 2, the growth pressure is different between Embodiment 3 and Embodiment 2. The growth pressure is an extremely critical factor for incorporation of In. As the growth pressure increases, the In incorporation efficiency also increases. Therefore, as the growth pressure increases, the saturation point can be reached with a smaller In supply mole fraction.

Comparing FIG. 9 and FIG. 10, there is a difference in the intensity variation in the neighborhood of the saturation point at which the PL emission intensity is maximum. Under the condition that the growth pressure is 300 Torr, when the In supply mole fraction is changed from 0.60 at the saturation point by ±0.10 as shown in FIG. 9, the PL intensity exhibits a value which is about 70% of the maximum value at the saturation point. On the other hand, under the condition that the growth pressure is 500 Torr, when the In supply mole fraction is changed from 0.30 at the saturation point by ±0.10 as shown in FIG. 10, the PL intensity decreases to a value which is about 30% of the maximum value at the saturation point.

Figure 11:
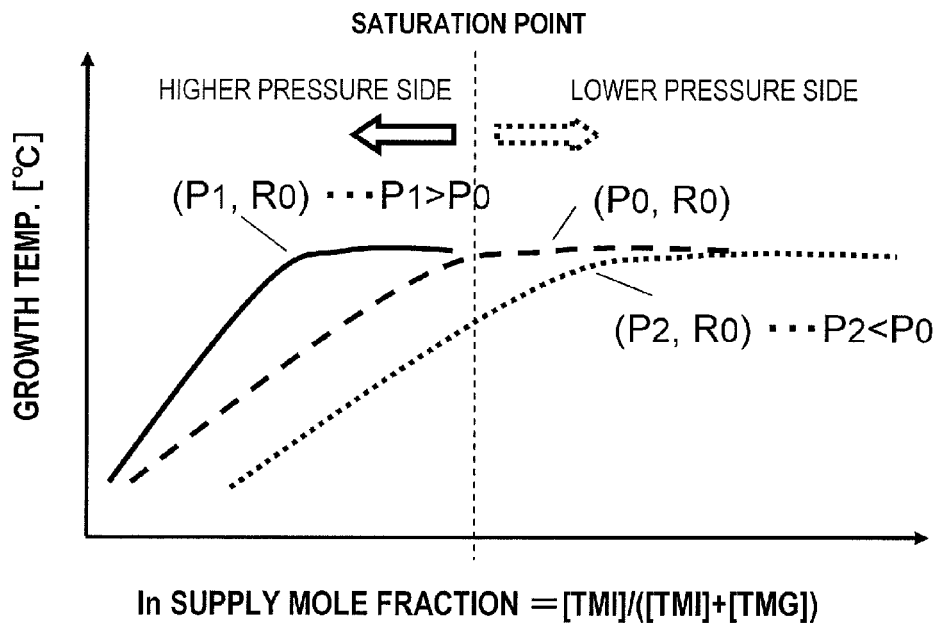
FIG. 11 is a graph schematically showing a variation of the characteristic curve which occurs depending on the pressure.

FIG. 11 is a graph schematically showing a variation of the characteristic curve which occurs due to a variation in pressure. As the pressure increases, the In incorporation efficiency improves so that the saturation point can be reached with a lower In supply mole fraction. In consideration of the source utilization efficiency, for example, it is preferred to increase the pressure. On the other hand, as described above, it is more likely that, if the pressure is high, the emission intensity and the emission efficiency largely vary depending on the In supply mole fraction. Therefore, to stabilize the emission intensity and the emission efficiency and increase the manufacturing yield, it is preferred to decrease the growth pressure. According to the experiments conducted by the present inventors, a preferred range of the growth pressure which is adopted in the present embodiment is 200 to 600 Torr. However, the fabrication method of the present embodiment is applicable even under atmospheric pressure.

Figure 12:
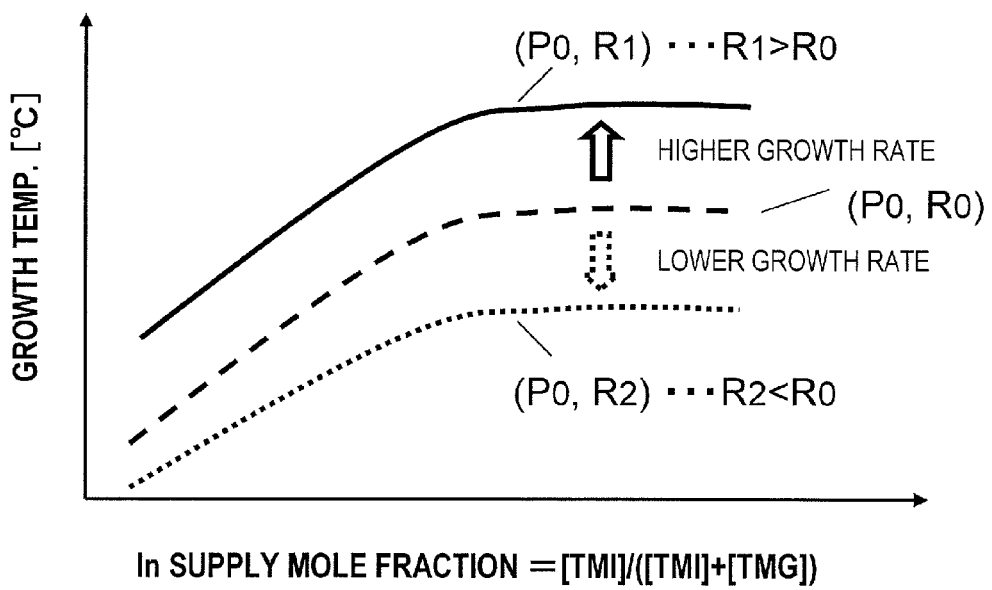
FIG. 12 is a graph schematically showing a variation of the characteristic curve which occurs depending on the growth rate.

FIG. 12 is a graph schematically showing a variation of the characteristic curve which occurs due to a variation in growth rate. As described above, as the growth rate is increased, the In incorporation efficiency improves. Therefore, to realize an identical emission wavelength, it is necessary to increase the growth temperature. As the growth rate decreases, to realize an identical emission wavelength, it is necessary to decrease the growth temperature.

Figure 13:
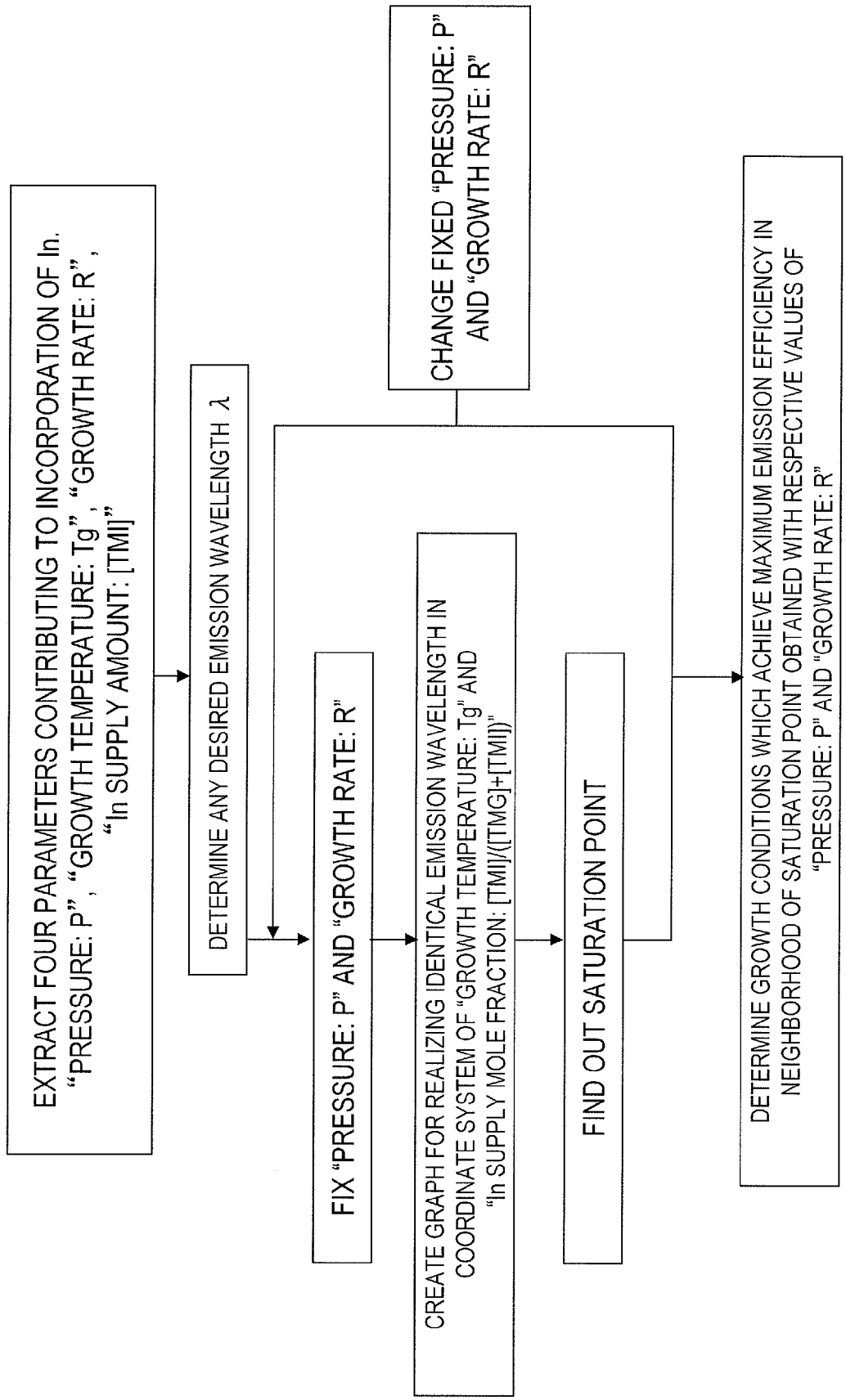
FIG. 13 is a flowchart for illustrating a fabrication method of the present embodiment.

Next, the procedure of a fabrication method of the present embodiment is described with reference to FIG. 13.

First, among the parameters which largely affect the In mole fraction, four parameters including "Pressure: P", "Growth Temperature: Tg", "Growth Rate: R (dependent on the Ga source supply amount: [TMG])", and "In Supply Amount: [TMI]" are extracted. Then, the intended emission wavelength, i.e., the In mole fraction, is determined.

Then, among the four parameters mentioned above, "Pressure: P" and "Growth Rate: R" are fixed. With "Pressure: P" and "Growth Rate: R" being fixed, the relationship between "Growth Temperature: Tg" and "In supply mole fraction: [TMI]/([TMI]+[TMG])" for growing an $In_xGa_{1-x}N$ (0<x<1) layer which has an intended In mole fraction is determined. This relationship is expressed by a curve (including a chain of line segments) in a two-dimensional coordinate system of "Growth Temperature: Tg" and "In supply mole fraction: [TMI]/([TMI]+[TMG])".

Then, the step of finding out the saturation point on the characteristic curve, which is at the boundary between the monotonic increase region and the saturation region, is performed.

Further, the step of finding out the saturation point is repeated while variously changing "Pressure: P" and "Growth Rate: R" that have been previously fixed. In the neighborhood of each of the thus-obtained saturation points, the growth conditions which can achieve the maximum emission efficiency at the identical emission wavelength can be determined.

The value of the "In supply mole fraction" of the saturation point may vary depending on the In incorporation efficiency. Also, the "In supply mole fraction" of the saturation point also depends on the type of a crystal growth apparatus. Therefore, the growth conditions at the saturation point which can be adopted in the present embodiment are not limited to the growth conditions of the present embodiment. The present embodiment can be implemented in a modified or varied form without departing from the spirit or scope of the present embodiment which is defined by the recitations of the claims. Thus, the descriptions provided in this specification are merely exemplary and should not be considered limiting in any manner.

EMBODIMENT 4

Hereinafter, an embodiment of a semiconductor light-emitting device fabrication method of the present embodiment is described with reference to FIG. 14.

A substrate 101 for crystal growth which is used in the present embodiment is capable of growth of (10-10) m-plane gallium nitride (GaN). Most preferably, it is a free-standing substrate of gallium nitride itself whose principal surface is an m-plane, but may be a substrate of silicon carbide (SiC) whose lattice constant is close to that of gallium nitride and which has a 4H or 6H structure with an m-plane principal surface. Alternatively, a sapphire substrate that also has an m-plane principal surface may be used. However, if a material that is different from the gallium nitride-based compound semiconductor is used for the substrate, an appropriate spacer layer or buffer layer is inserted between the substrate and a gallium nitride-based compound semiconductor layer which is to be deposited thereon.

Deposition of the gallium nitride-based compound semiconductor, represented by the $In_xGa_{1-x}N$ (0<x<1) layer, is realized by MOCVD. Firstly, the substrate 101 is washed with a buffered hydrofluoric acid solution (BHF) and is thereafter sufficiently washed with water and dried. After having been washed, the substrate 101 is placed in a reactor of a MOCVD apparatus in such a manner that the substrate 101 is kept away from air as much as possible. Thereafter, the substrate is heated to 850° C. while an ammonium ($NH_3$) gas is supplied as the nitrogen source and hydrogen ($H_2$) and nitrogen ($N_2$) are supplied as the carrier gases, whereby the substrate surface is cleaned.

Then, trimethylgallium (TMG) or triethylgallium (TEG) and silane ($SiH_4$) are supplied, and the substrate is heated to about 1100° C., whereby an n-GaN layer 102 is deposited. Silane is a source gas for supplying silicon (Si) that is used as an n-type dopant. The growth rate for deposition of this n-GaN layer 102 is about 10.0 to 40.0 nm/min.

Then, the supply of TMG and $SiH_4$ which are Group III source gases is stopped, and the supply of hydrogen is stopped so that only the nitrogen gas is supplied as the carrier gas. Then, the GaN layer 103 is deposited with the temperature of the substrate being decreased to 770° C., which is the growth temperature at the saturation point and which is the optimum growth condition of the present embodiment.

Thereafter, supply of trimethylindium (TMI) is started, whereby an $In_xGa_{1-x}N$ (0<x<1) well layer 104 is deposited. As the growth condition for the deposition, the In supply mole fraction (=[TMI]/([TMI]+[TMG])) is set to 0.60. The GaN barrier layer 103 and the $In_xGa_{1-x}N$ (0<x<1) well layer 104 are alternately deposited in three cycles. The thickness of the GaN barrier layer 103 is 30 nm, and the thickness of the $In_xGa_{1-x}N$ (0<x<1) well layer 104 is 15 nm.

After the formation of the GaN/InGaN multi-quantum well light-emitting layer 105, the supply of TMI is stopped, and the growth temperature is increased to 1000° C. And, bis-cyclopentadienyl magnesium ($Cp_2Mg$) which contains Mg that is used as a p-type dopant is supplied, whereby a p-GaN layer 106 is deposited.

After the substrate is removed out of the reactor, only predetermined regions of the p-GaN layer 106 and the GaN/InGaN multi-quantum well light-emitting layer 105 are removed, e.g., etched away, by photolithography, or the like, such that part of the n-GaN layer 102 is exposed. On the exposed part of the n-GaN layer 102, an n-type electrode 107 is formed of, for example, Ti/Al. Meanwhile, in a predetermined region of the surface of the p-GaN layer 106, a p-type electrode 108 is formed of, for example, Ni/Au.

Hereinafter, the characteristics of a light-emitting device which is fabricated according to the above-described fabrication method are described.

Figure 15:
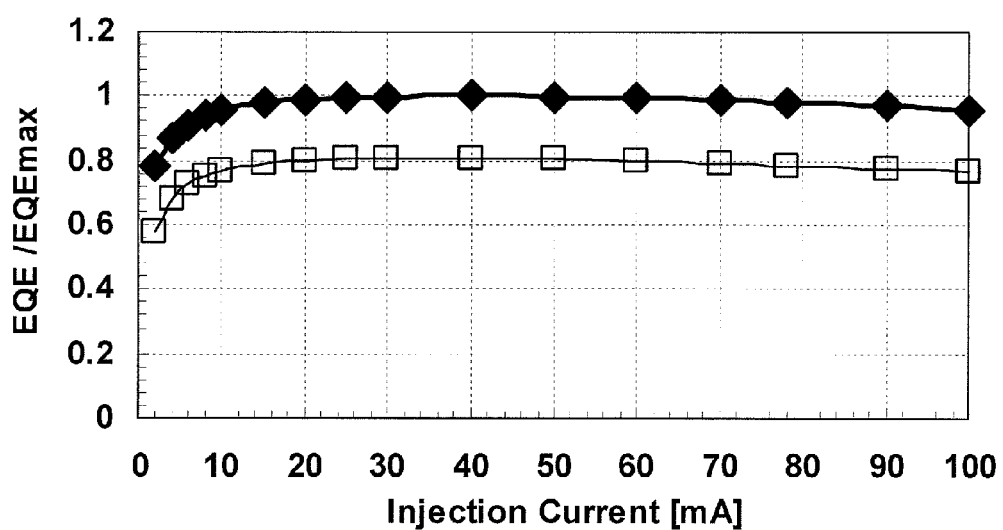
FIG. 15 is a graph showing the relationship of the external quantum efficiency and the injected current in a light-emitting device of Embodiment 4 (♦) and a light-emitting device of a comparative example (□).

FIG. 15 is a graph showing a characteristic of a light-emitting device of the present embodiment (♦) and a characteristic of a comparative example (□). In the graph, the abscissa axis represents an injected current, and the ordinate axis represents a normalized value of the External Quantum Efficiency (EQE).

The difference between the embodiment and the comparative example resides only in that, in the comparative example, an active layer was formed under conditions that are deviated from the growth conditions corresponding to the saturation point. Specifically, in the comparative example, the $In_xGa_{1-x}N$ (0<x<1) well layer 104 was formed under the conditions that the growth temperature=760° C. and the In supply mole fraction=[TMI]/([TMI]+[TMG])=0.50. These values of the growth temperature and the In supply mole fraction are within the monotonic increase region.

From the foregoing, it is appreciated that, as seen from FIG. 15, a light-emitting device which has an $In_xGa_{1-x}N$ (0<x<1) well layer that is optimized according to a fabrication method of the present embodiment is a very effective fabrication method.

The present embodiment can be implemented in a long wavelength range in which the In mole fraction is high. The emission wavelength is not limited to around 400 nm. The growth conditions for the $In_xGa_{1-x}N$ (0<x<1) layer can be optimized within a wide emission wavelength range which is extended to 520 nm.

Figure 16:
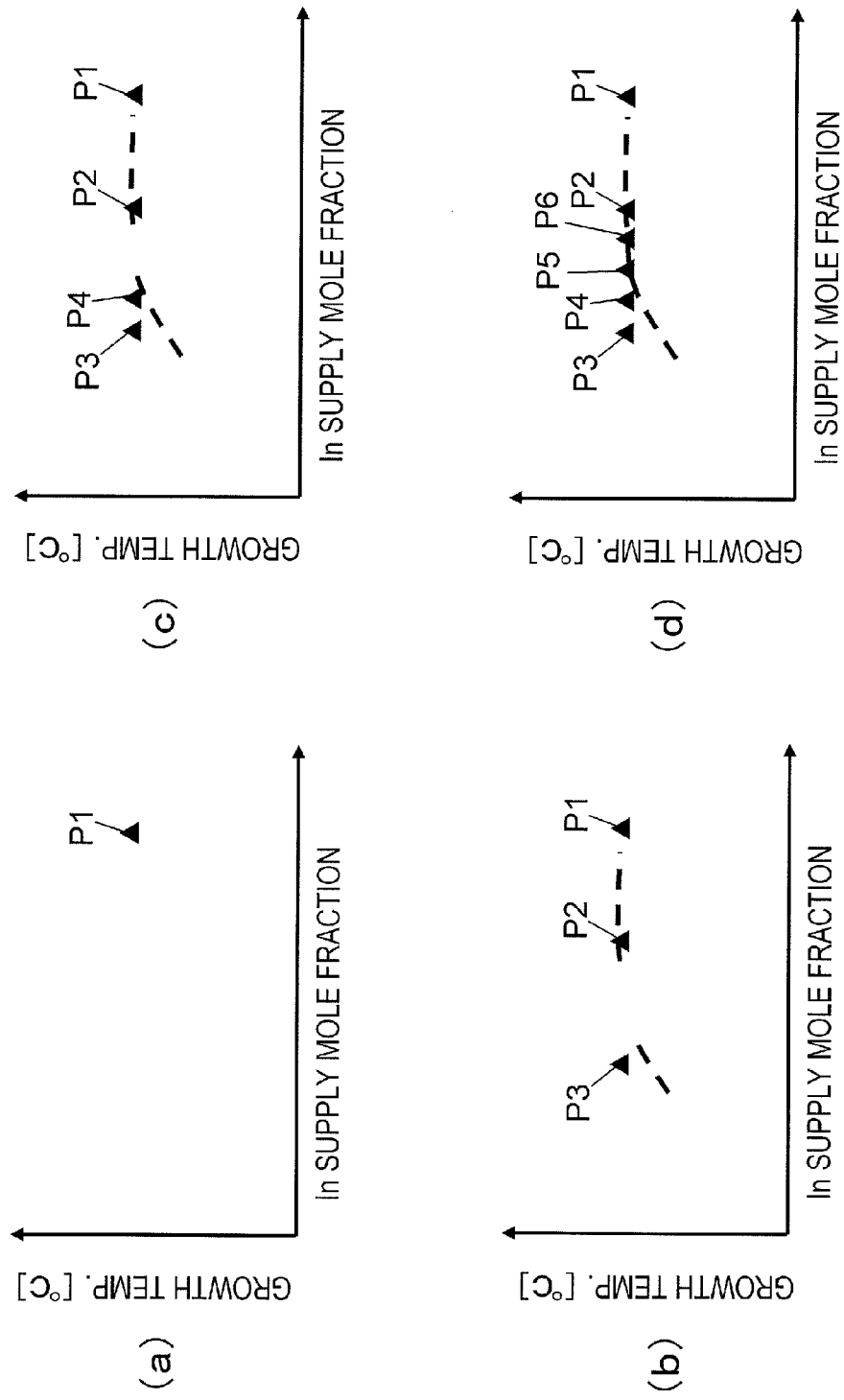
FIGS. 16(a) to 16(d) are diagrams showing an example of a growth condition determination method for a gallium nitride-based compound semiconductor layer according to the present embodiment.

Next, another example of the method of determining the conditions for growth of a gallium nitride-based compound semiconductor layer whose principal surface is a non-polar plane or a semi-polar plane by metalorganic chemical vapor deposition (growth condition determination method) is described with reference to FIG. 16.

Here, suppose that the growth conditions for formation of an $In_{0.15}Ga_{85}N$ layer by means of m-plane growth are to be determined. First, the step of forming a plurality of m-plane $In_yGa_{1-y}N$ (0<y<1) layers by MOCVD under different growth conditions is performed.

Specifically, under the conditions that the pressure and the growth rate are fixed to given values, the first $In_{x1}Ga_{1-x1}N$ (0<x1<1) layer is formed with the first In supply mole fraction. Here, the In mole fraction x1 of the first $In_xGa_{1-x}N$ (0<x<1) layer is set to a value which is equal to the In mole fraction x of an $In_xGa_{1-x}N$ (0<x<1) layer in the final form of the semiconductor light-emitting device. When the value of the growth temperature which can realize the intended In mole fraction x1=x with the first In supply mole fraction under the conditions that the pressure and the growth rate have the given values is not exactly known, a plurality of $In_yGa_{1-y}N$ (0<y<1) layers are grown at different growth temperatures. In this case, the In mole fraction y exhibits different values depending on the growth temperature. Then, the emission wavelength or the In mole fraction y of the plurality of resultant $In_yGa_{1-y}N$ (0<y<1) layers is measured. Thus, the growth temperature employed for obtaining one of the plurality of $In_yGa_{1-y}N$ (0<y<1) layers in which the In mole fraction y realizes the intended In mole fraction x=x1 can be determined. In this example, the growth temperature is determined such that x1=0.15 is realized with the first In supply mole fraction, and the first $In_{x1}Ga_{1-x1}N$ (0<x1<1) layer is formed at the determined growth temperature.

As the first In supply mole fraction, a value which is ensured to be within the saturation region under the conditions that the pressure and the growth rate have the given values is selected. When the pressure, the growth rate, and the In supply mole fraction are determined, the growth temperature employed for formation of an $In_{0.15}Ga_{0.85}N$ layer is uniquely determined. In Embodiment 1, when an $In_{0.1}Ga_{0.9}N$ layer is grown under the conditions that the pressure is 300 Torr, the growth rate is about 6.0 nm/min, and the In supply mole fraction is 0.83, the growth temperature is set to 745° C. Such a value of the growth temperature within the saturation region varies depending on the pressure, the growth rate, and the In mole fraction x of an m-plane (0<x<1) layer which is to be grown. FIG. 16(a) is a graph where, for $In_{x1}Ga_{1-x1}N$ (x1=0.15) as an example, point P1 which corresponds to the first In supply mole fraction and its growth temperature is plotted.

Then, at a growth temperature which is equal to the growth temperature employed for formation of the first $In_{0.15}Ga_{0.85}N$ layer, an $In_{x2}Ga_{1-x2}N$ (0<x2<1) layer is formed with the second In supply mole fraction that is lower than the first In supply mole fraction. The values of the pressure and the growth rate remain fixed. If the In mole fraction x2 of the thus-formed second $In_{x2}Ga_{1-x2}N$ (0<x2<1) layer is equal to the In mole fraction x1 of the first $In_{x1}Ga_{1-x1}N$ (0<x1<1) layer, the second In supply mole fraction is also within the saturation region. On the other hand, if the In mole fraction x2 of the second $In_{x2}Ga_{1-x2}N$ (0<x2<1) layer is different from the In mole fraction x1 of the first $In_{x1}Ga_{1-x1}N$ (0<x1<1) layer, the second In supply mole fraction is also within the monotonic increase region. In this example, it is assumed that the second In supply mole fraction is set to a value which is slightly smaller than the first In supply mole fraction, and as a result, the In mole fraction x2 is also within the saturation region.

Then, at a growth temperature which is equal to the growth temperature employed for formation of the first (0<x1<1) layer, the third $In_{x3}Ga_{1-x3}N$ (0<x3<1) layer is formed with the third In supply mole fraction that is lower than the second In supply mole fraction. The values of the pressure and the growth rate remain fixed. If the In mole fraction x3 of the thus-formed third $In_{x3}Ga_{1-x3}N$ (0<x3<1) layer is different from the In mole fraction x2 of the second $In_{x2}Ga_{1-x2}N$ (0<x2<1) layer, it is determined that the third In supply mole fraction is within the monotonic increase region. FIG. 16(b) is a graph where points P1 to P3 are plotted which correspond to the first to third In supply mole fractions and their growth temperatures. In this example, to realize x3=x2 with the third In supply mole fraction, it is necessary to decrease the growth temperature.

The In supply mole fraction of the saturation point is estimated to be between the second In supply mole fraction and the third In supply mole fraction. The second In supply mole fraction may be approximately adopted as the In supply mole fraction of the saturation point. Here, to determine the position of the saturation point with improved accuracy, m-plane growth of an $In_{x'}Ga_{1-x'}N$ (0<x'<1) layer is performed under such a condition that the In supply mole fraction is made closer to the second In supply mole fraction while the values of the pressure, the growth rate, and the growth temperature are fixed. As shown in FIG. 16(c) and FIG. 16(d), m-plane growth of the $In_{x'}Ga_{1-x'}N$ (0<x'<1) layer is performed under such a condition that the In supply mole fraction is increased little by little, and a value of the In supply mole fraction with which the In mole fraction x' of the resultant $In_{x'}Ga_{1-x'}N$ (0<x'<1) layer reaches an intended value x1=x is obtained. In the example shown in FIG. 16(d), the intended In mole fraction x is obtained at points P5 and P6. Thus, point P5 can be adopted as the saturation point.

The method of determining the saturation point is not limited to the above example. For example, the In mole fraction x or the emission wavelength of the obtained $In_xGa_{1-x}N$ (0<x<1) layer is measured while the In supply fraction is decreased little by little from the initial value in the saturation region, and a value of the In supply mole fraction at which the measured value starts to deviate may be adopted as the In supply fraction of the saturation point. On the contrary, the In mole fraction x or the emission wavelength of the obtained $In_xGa_{1-x}N$ (0<x<1) layer is measured while the In supply fraction is increased little by little from the initial value in the monotonic increase region, and a value of the In supply mole fraction at which the measured value starts to converge to a constant value may be adopted as the In supply fraction of the saturation point.

An actual surface (principal surface) of the m-plane semiconductor layer does not need to be perfectly parallel to the m-plane but may be inclined from the m-plane by a small angle (which is greater than 0° and smaller than ±1°). Forming a substrate or semiconductor layer which has a surface perfectly parallel to the m-plane is difficult in view of the manufacturing techniques. Thus, when an m-plane substrate or m-plane semiconductor layer is formed using the existing manufacturing techniques, a surface actually formed would inevitably be inclined from the ideal m-plane. The angle and azimuth of the inclination varies depending on the manufacturing process, and therefore, precisely controlling the inclination angle and inclination azimuth of the surface is difficult.

In some cases, the surface (principal surface) of the substrate or semiconductor is intentionally inclined from the m-plane by an angle of not less than 1°. In an embodiment which will be described below, the surface (principal surface) of a gallium nitride-based compound semiconductor layer is intentionally inclined from the m-plane by an angle of not less than 1°.

ANOTHER EMBODIMENT

A gallium nitride-based compound semiconductor light-emitting device of the present embodiment includes a gallium nitride-based compound semiconductor layer whose principal surface is inclined from the m-plane by an angle of not less than 1°. Except for this aspect, the configuration of the present embodiment is identical with that of Embodiment 4 shown in FIG. 14.

Figure 14:
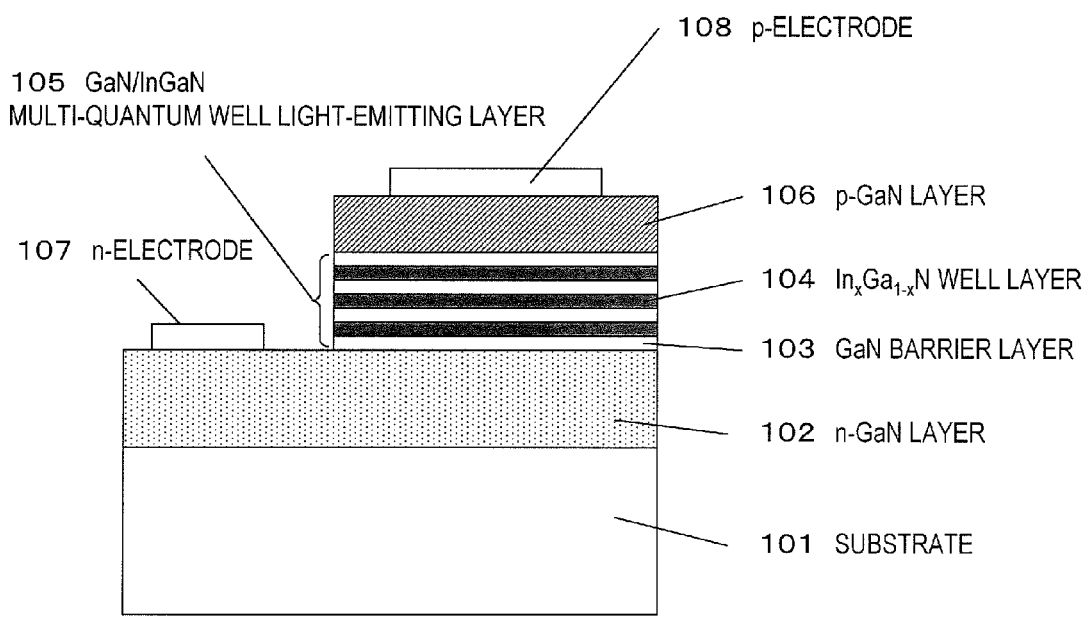
FIG. 14 is a cross-sectional view schematically showing a configuration of a gallium nitride-based compound semiconductor light-emitting device of Embodiment 4 of the present invention.

In the gallium nitride-based compound semiconductor light-emitting device of the present embodiment, the principal surface of the substrate 101 shown in FIG. 14 is inclined from the m-plane by an angle of not less than 1°. The substrate 101 of such a structure is commonly called "off-substrate". The off-substrate can be formed by performing the step of slicing off a substrate from monocrystalline ingot and polishing the surface of the substrate such that the surface intentionally inclined in a specific azimuth from the m-plane is used as the principal surface. When various semiconductor layers are formed on the inclined principal surface of the substrate, the surfaces (principal surfaces) of these formed layers are also inclined from the m-plane.

Figure 17:
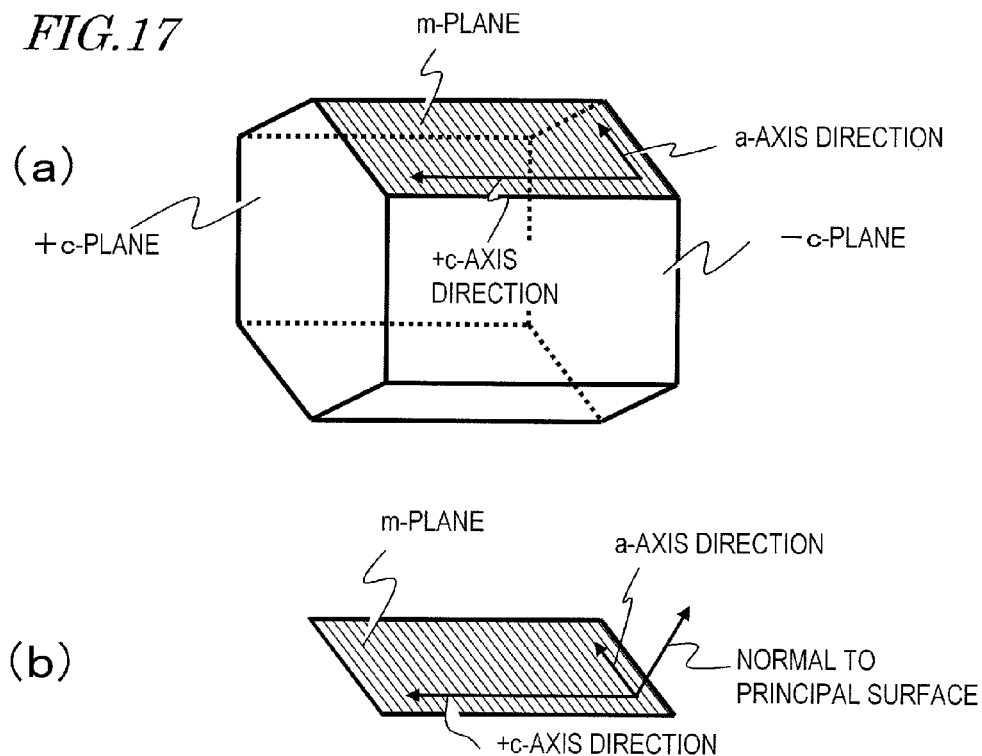
FIG. 17(a) schematically shows the crystalline structure of GaN-based compound semiconductor (wurtzite crystal structure).
FIG. 17(b) is a perspective view illustrating the relationship among the normal to the m-plane, the +c-axis direction, and the a-axis direction.

Next, details of the inclination of the GaN-based compound semiconductor layer of the present embodiment are described with reference to FIG. 17.

Figure 2:
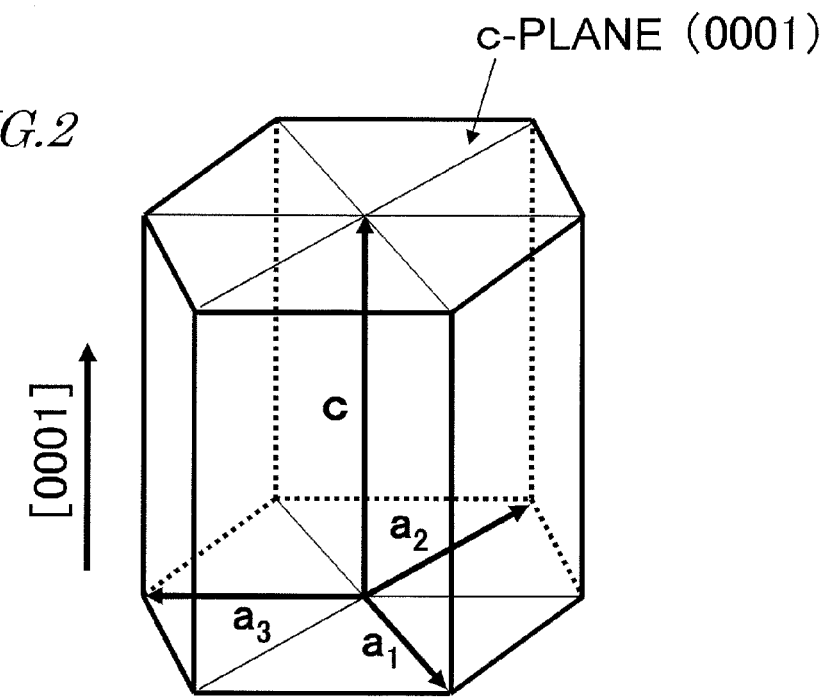
FIG. 2 is a perspective view showing primitive vectors $a_1$, $a_2$, $a_3$ and c of a wurtzite crystal structure.
Figure 3:
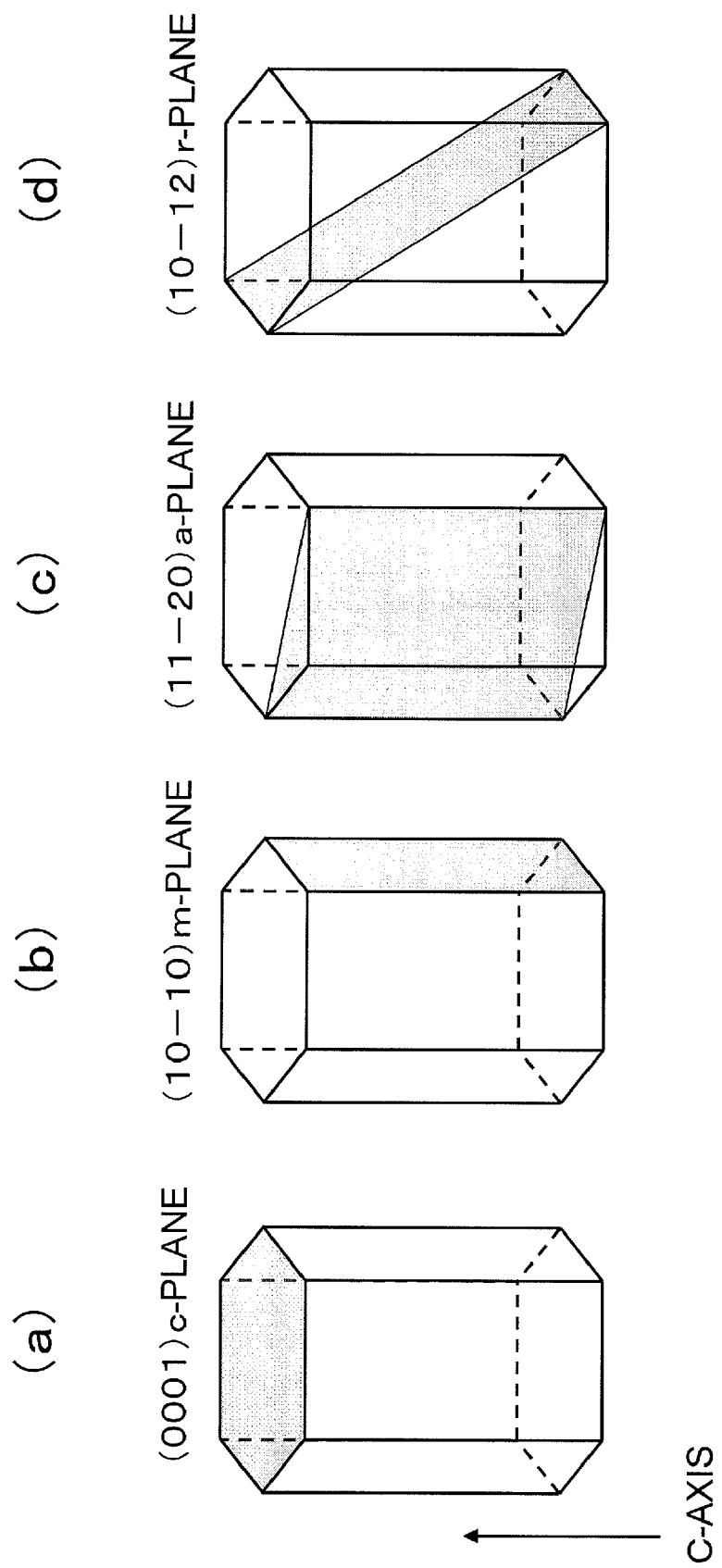
FIGS. 3(a) to 3(d) are schematic diagrams showing representative crystallographic plane orientations of a hexagonal wurtzite structure.

FIG. 17(a) schematically shows the crystalline structure of the GaN-based compound semiconductor (wurtzite crystal structure), corresponding to 90° rotation of the crystalline structure of FIG. 2. The c-planes of the GaN crystal include a +c-plane and a −c-plane. The +c-plane is a (0001) plane over which Ga atoms are exposed and is referred to as "Ga plane". On the other hand, the −c-plane is a (0001) plane over which N (nitrogen) atoms are exposed and is referred to as "N plane". The +c-plane and the −c-plane are parallel to each other. Both of these planes are perpendicular to the m-plane. The c-planes have polarity and therefore can be classified into the +c-plane and the −c-plane. Classifying the a-plane that is a non-polar plane into the +a-plane and the −a-plane is non-sensical.

The +c-axis direction shown in FIG. 17(a) is a direction perpendicularly extending from the −c-plane to the +c-plane. On the other hand, the a-axis direction corresponds to the unit vector $a_2$ of FIG. 2 and is oriented in [−12-10] direction that is parallel to the m-plane. FIG. 17(b) is a perspective view illustrating the relationship among the normal to the m-plane, the +c-axis direction, and the a-axis direction. The normal to the m-plane is parallel to the [10-10] direction. As shown in FIG. 17(b), the normal to the m-plane is perpendicular to both the +c-axis direction and the a-axis direction.

The inclination of the principal surface of the GaN-based compound semiconductor layer from the m-plane by an angle of 1° or greater means that the normal to the principal surface of the semiconductor layer is inclined from the normal to the m-plane by an angle of 1° or greater.

Figure 18:
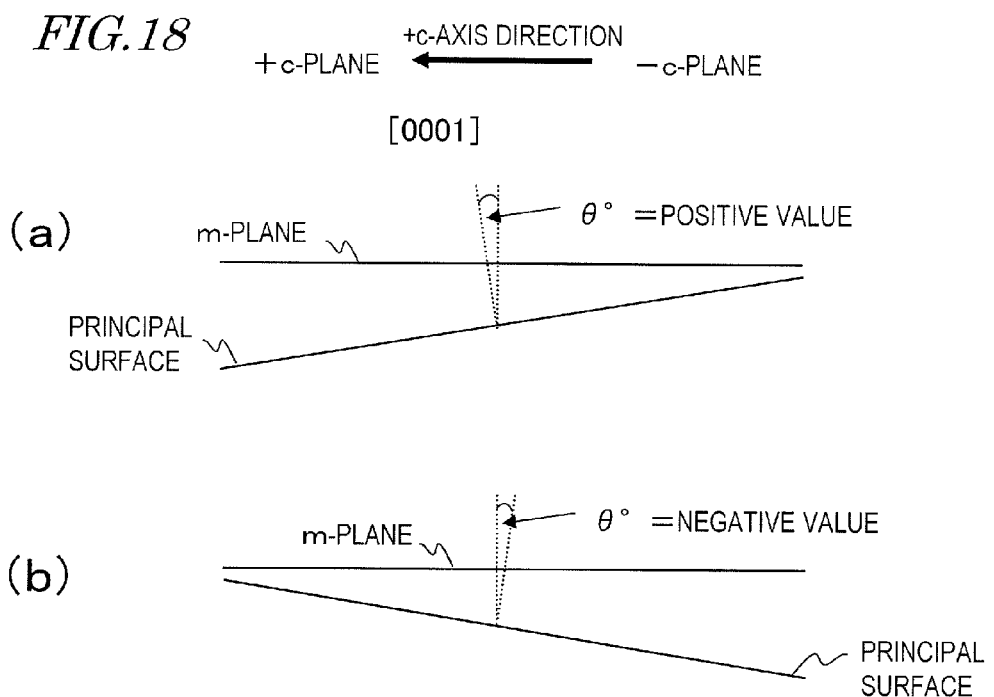
FIGS. 18(a) and 18(b) are cross-sectional views which illustrate the positional relationship between the principal surface of the GaN-based compound semiconductor layer and the m-plane.

Next, refer to FIG. 18. FIGS. 18(a) and 18(b) are cross-sectional views which illustrate the relationship between the principal surface of the GaN-based compound semiconductor layer and the m-plane. These diagrams are cross-sectional views which are perpendicular to both the m-plane and the c-plane. In FIG. 18, an arrow which represents the +c-axis direction is shown. As shown in FIG. 17, the m-plane is parallel to the +c-axis direction. Therefore, a normal vector of the m-plane is perpendicular to the +c-axis direction.

In the examples shown in FIGS. 18(a) and 18(b), the normal vector of the principal surface of the GaN-based compound semiconductor layer is inclined in the c-axis direction from the normal vector of the m-plane. More specifically, in the example of FIG. 18(a), the normal vector of the principal surface is inclined toward the +c-plane side. In the example of FIG. 18(b), the normal vector of the principal surface is inclined toward the −c-plane side. In this specification, the inclination angle of the normal vector of the principal surface relative to the normal vector of the m-plane (inclination angle θ) in the former case is represented by a positive value, and the inclination angle θ in the latter case is represented by a negative value. In any of these cases, the statement that "the principal surface is inclined in the c-axis direction" holds true.

Figure 19:
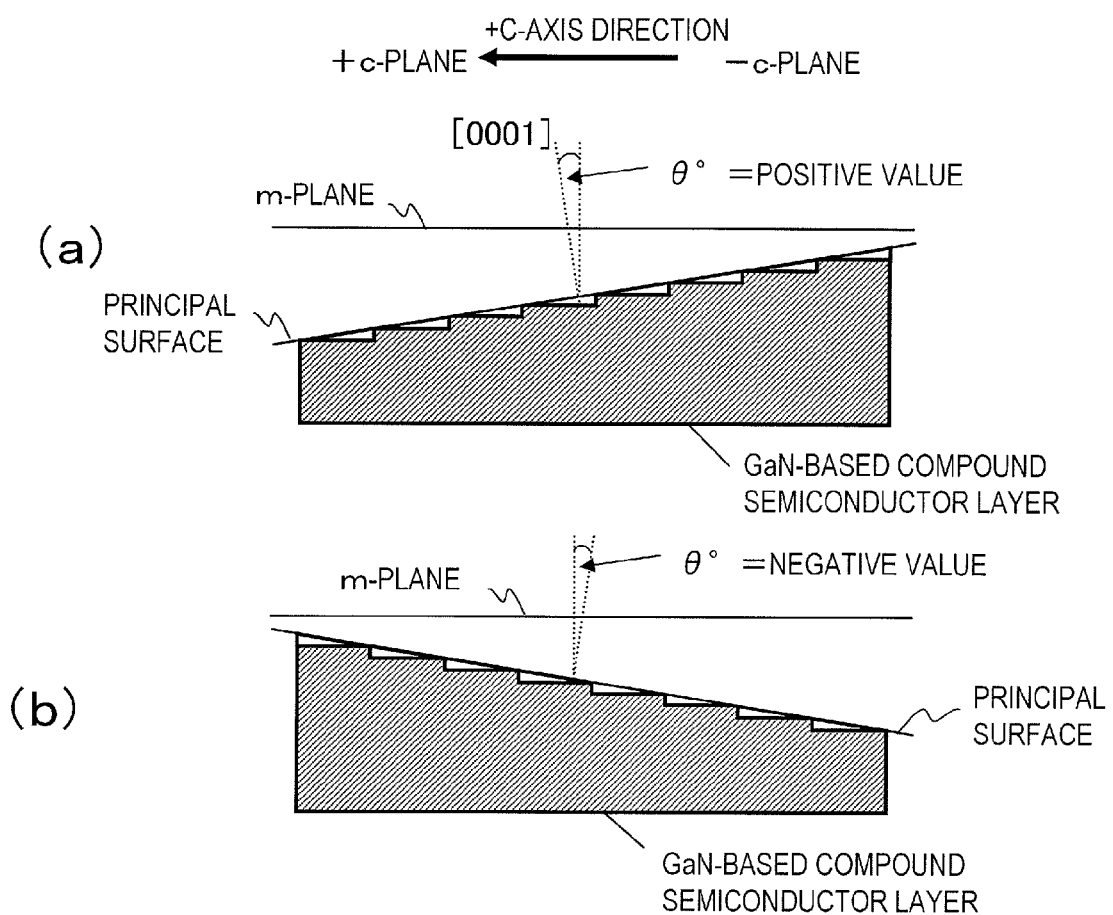
FIGS. 19(a) and 19(b) are cross-sectional views each schematically showing the principal surface of the p-type GaN-based compound semiconductor layer 8 and its neighboring region.

In this embodiment, the inclination angle is in the range of 1° to 5° or in the range of −5° to −1°. In this case, the effects of the present invention can also be provided as well as in the case where the inclination angle is greater than 0° and smaller than ±1°. Hereinafter, the reasons for this are described with reference to FIG. 19. FIGS. 19(a) and 19(b) are cross-sectional views corresponding to FIGS. 18(a) and 18(b), respectively, showing a neighboring region of the principal surface in the GaN-based compound semiconductor layer 8 which is inclined in the c-axis direction from the m-plane. When the inclination angle θ is 5° or smaller, the principal surface in the GaN-based compound semiconductor layer 8 has a plurality of steps as shown in FIGS. 19(a) and 19(b). Each step has a height equivalent to a monoatomic layer (2.7 Å). The steps are parallel to each other with generally equal intervals (30 Å or more). With such an arrangement of the steps, it can be said that the principal surface as a whole is inclined from the m-plane. However, upon closer observation, a large number of m-plane regions are exposed over the principal surface. The reason why the surface of the GaN-based compound semiconductor layer whose principal surface is inclined from the m-plane has such a configuration is that the m-plane as a crystalline plane is intrinsically very stable.

It is inferred that basically the same phenomenon would occur even when the inclination direction of the normal vector of the principal surface is directed to a plane orientation different from the +c-plane and the −c-plane. When the normal vector of the principal surface is inclined in for example the a-axis direction, basically the same phenomenon occurs so long as the inclination angle is in the range of 1° to 5°.

Therefore, even in the case of a gallium nitride-based compound semiconductor layer whose principal surface is inclined from the m-plane in a certain azimuth by an angle of not less than 1° and not more than 5°, a characteristic curve such as shown in FIG. 5 can be obtained. Thus, the above-described effects can be achieved using the method of the present embodiment.

Note that, when the absolute value of the inclination angle θ is greater than 5°, the internal quantum efficiency deteriorates due to a piezoelectric field. As such, if the piezoelectric field frequently occurs, realizing a semiconductor light-emitting device by means of m-plane growth has a small significance. Thus, according to the present invention, the absolute value of the inclination angle θ is limited to 5° or smaller. However, even when the inclination angle θ is set to for example 5°, the actual inclination angle θ may deviate from 5° by about ±1° due to variations in fabrication. Completely removing the variations in fabrication is difficult, while such a small angle deviation would not interrupt the effects of the present invention.

The present invention is also applicable to a case where the semiconductor layer has a principal surface which is inclined from the a-plane or the r-plane by an angle of not more than 5° because the above-described step-terrace structure is formed.

From the above, in the present invention, "a gallium nitride-based compound semiconductor layer whose principal surface is a non-polar plane or a semi-polar plane" is not limited to a gallium nitride-based compound semiconductor layer whose principal surface is exactly parallel to a crystallographic plane, such as m-, a-, and r-planes, but may include a gallium nitride-based compound semiconductor layer whose principal surface is inclined from the crystallographic plane by an angle of not more than 5°.

INDUSTRIAL APPLICABILITY

The present invention relates to a method of growing a gallium nitride-based compound semiconductor on a plane of such a plane orientation that the In incorporation efficiency is lower than in the case of c-plane growth, such that an $In_xGa_{1-x}N$ (0<x<1) layer which is capable of achieving the maximum emission efficiency at an intended emission wavelength can be formed. According to the present invention, a gallium nitride-based compound semiconductor light-emitting device of high luminance and high emission efficiency can be realized. Thus, the present invention has wider applicability to various lighting devices, such as a next-generation high luminance white LED.

REFERENCE SIGNS LIST 10 light-emitting device
11 substrate
12 GaN layer as underlayer
13 GaN barrier layer
14 $In_xGa_{1-x}N$ (0<x<1) well layer
15 GaN/InGaN multi-quantum well light-emitting layer
101 substrate
102 n-GaN layer
103 GaN barrier layer
104 $In_xGa_{1-x}N$ (0<x<1) well layer
105 GaN/InGaN multi-quantum well light-emitting layer
106 p-GaN layer
107 n-type electrode
108 p-type electrode

The invention claimed is:

1. A method of fabricating a gallium nitride-based compound semiconductor light-emitting device, including forming a gallium nitride-based compound semiconductor layer whose principal surface is a non-polar plane or a semi-polar plane by metalorganic chemical vapor deposition, where parameters that define growth conditions of the metalorganic chemical vapor deposition include a pressure, a growth rate, a growth temperature, and an In supply mole fraction that is a mole fraction of an In source gas contained in a supplied Group III source gas, a curve that represents a relationship between the growth temperature and the In supply mole fraction for formation of an $In_xGa_{1-x}N$ (0<x<1) layer of an identical emission wavelength in a case where the pressure and the growth rate are constant having a saturation point which exists between a region where the growth temperature monotonically increases according to an increase of the In supply mole fraction and a region where the growth temperature saturates, the method comprising the steps of:
- (A) determining the saturation point on the curve;
- (A2) determining a growth condition which corresponds to the saturation point determined in step (A); and
- (B) growing an $In_xGa_{1-x}N$ (0<x<1) layer whose principal surface is a non-polar plane or a semi-polar plane under the determined growth condition.

2. The method of claim 1, wherein step (A) includes
- (a1) forming a plurality of $In_yGa_{1-y}N$ (0<y<1) layers whose principal surface is a non-polar plane or a semi-polar plane by metalorganic chemical vapor deposition under different growth conditions;
- (a2) determining a relationship between the growth temperature and the In supply mole fraction in a case where the pressure and the growth rate are constant based on a growth condition employed for formation of $In_xGa_{1-x}N$ (0<x<1) layers whose emission wavelengths are equal among the plurality of $In_yGa_{1-y}N$ (0<y<1) layers; and
- (a3) determining a saturation point on a curve which represents the relationship between the growth temperature and the In supply mole fraction, the saturation point being between a region where the growth temperature monotonically increases according to an increase of the In supply mole fraction and a region where the growth temperature saturates.

3. The method of claim 2, wherein step (a2) includes determining, for each of different combinations of the pressure and the growth rate, a relationship between the growth temperature and the In supply mole fraction in a case where the pressure and the growth rate are constant.

4. The method of claim 1, wherein the $In_xGa_{1-x}N$ (0<x<1) layer is a well layer included in a single quantum well light-emitting layer or a multi-quantum well light-emitting layer.

5. The method of claim 4, wherein a thickness of the well layer is not less than 2 nm and not more than 20 nm.

6. The method of claim 4, wherein a thickness of the well layer is not less than 6 nm and not more than 16 nm.

7. The method of claim 1, wherein
step (B) includes (b1) regulating a growth pressure so as to be in a range from 200 Torr to 600 Torr, and
step (B) includes growing an $In_xGa_{1-x}N$ (0<x<1) layer with a growth temperature and an In supply mole fraction which correspond to a saturation point on a curve that represents a relationship between the growth temperature and the In supply mole fraction which is obtained for the regulated growth pressure and the selected growth rate.

8. The method of claim 1, wherein
step (B) includes (b1) regulating a growth pressure so as to be an atmospheric pressure; and
step (B) includes growing an $In_xGa_{1-x}N$ (0<x<1) layer with a growth temperature and an In supply mole fraction which correspond to a saturation point on a curve that represents a relationship between the growth temperature and the In supply mole fraction which is obtained for the regulated growth pressure and the selected growth rate.

9. A gallium nitride-based compound semiconductor layer growth condition determination method for determining a condition for growing a gallium nitride-based compound semiconductor layer whose principal surface is a non-polar plane or a semi-polar plane by metalorganic chemical vapor deposition, where parameters that define growth conditions of the metalorganic chemical vapor deposition include a pressure, a growth rate, a growth temperature, and an In supply mole fraction that is a mole fraction of an In source gas contained in a supplied Group III source gas, the method comprising the steps of:
- (a1) forming a plurality of $In_yGa_{1-y}N$ (0<y<1) layers whose principal surface is a non-polar plane or a semi-polar plane by metalorganic chemical vapor deposition under different growth conditions;
- (a2) determining a relationship between the growth temperature and the In supply mole fraction in a case where the pressure and the growth rate are constant based on a growth condition employed for formation of $In_xGa_{1-x}N$ (0<x<1) layers whose emission wavelengths are equal among the plurality of $In_yGa_{1-y}N$ (0<y<1) layers; and
- (a3) determining a saturation point on a curve which represents the relationship between the growth temperature and the In supply mole fraction, the saturation point being between a region where the growth temperature monotonically increases according to an increase of the In supply mole fraction and a region where the growth temperature saturates.

10. The method of claim 9, wherein step (a1) and step (a2) include
forming a first $In_{x1}Ga_{1-x1}N$ (0<x1<1) layer with a first In supply mole fraction,
forming a second $In_{x2}Ga_{1-x2}N$ (0<x2<1) layer with a second In supply mole fraction at a growth temperature which is equal to a growth temperature employed for formation of the first $In_{x1}Ga_{1-x1}N$ (0<x1<1) layer, the second In supply mole fraction being lower than the first In supply mole fraction, and
forming a third $In_{x3}Ga_{1-x3}N$ (0<x3<1) layer with a third In supply mole fraction at a growth temperature which is equal to the growth temperature for formation of the first $In_{x1}Ga_{1-x1}N$ (0<x1<1) layer, the third In supply mole fraction being lower than the second In supply mole fraction.

11. The method of claim 10 wherein, in step (a3), when x2 is equal to x1 and x3 is different from x2, the third In supply mole fraction is selected as an In supply mole fraction that corresponds to a saturation point.

* * * * *